(12) United States Patent
Tcaciuc et al.

(10) Patent No.: US 10,897,068 B2
(45) Date of Patent: Jan. 19, 2021

(54) SYSTEMS AND DEVICES FOR FILTERING ELECTRICAL SIGNALS

(71) Applicant: D-WAVE SYSTEMS INC., Burnaby (CA)

(72) Inventors: Alexandr M. Tcaciuc, New Westminster (CA); Loren J. Swenson, Burnaby (CA); George E. G. Sterling, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 17 days.

(21) Appl. No.: 16/134,592

(22) Filed: Sep. 18, 2018

(65) Prior Publication Data
US 2019/0089031 A1  Mar. 21, 2019

Related U.S. Application Data

(60) Provisional application No. 62/560,491, filed on Sep. 19, 2017.

(51) Int. Cl.
| | |
|---|---|
| *H01P 1/217* | (2006.01) |
| *H01P 11/00* | (2006.01) |
| *H01P 1/202* | (2006.01) |
| *H01P 3/06* | (2006.01) |
| *H01L 39/16* | (2006.01) |
| *H01L 39/24* | (2006.01) |
| *H01L 27/18* | (2006.01) |
| *H01L 39/14* | (2006.01) |

(52) U.S. Cl.
CPC .............. *H01P 1/217* (2013.01); *H01L 27/18* (2013.01); *H01L 39/14* (2013.01); *H01L 39/16* (2013.01); *H01L 39/24* (2013.01); *H01P 3/06* (2013.01); *H01P 1/202* (2013.01); *H01P 11/005* (2013.01); *H01P 11/007* (2013.01)

(58) Field of Classification Search
CPC .......... H01P 1/217; H01P 1/207; H01P 1/202; H01P 11/007
USPC ....................................... 333/99 S, 206, 207
See application file for complete search history.

(56) References Cited

U.S. PATENT DOCUMENTS

| | | |
|---|---|---|
| 2,865,006 A | 12/1958 | Samuel |
| 4,797,596 A | 1/1989 | Tsuzurahara |
| | (Continued) | |

OTHER PUBLICATIONS

Bladh, K. et al., "Comparison of Cryogenic Filters for Use in Single Electronics Experiments," Review of Scientific Instruments vol. 74, No. 3, Mar. 2003, 5 pages.

(Continued)

*Primary Examiner* — Rakesh B Patel
(74) *Attorney, Agent, or Firm* — Cozen O'Connor

(57) ABSTRACT

Adaptions and improvements to coaxial metal powder filters include distributing a dissipative matrix mixture comprising superconductive material, metal powder, epoxy, and/or magnetic material within a volume defined by an outer tubular conductor and inner conductor. The frequency response of the filter may be tuned by exploiting the energy gap frequency of superconductive material in the dissipative matrix. The inner surface of the outer tubular conductor may be covered with a superconductive material. For a dissipative matrix comprising magnetic material or superconductive powder particles of a certain size, an external magnetic field can be applied to tune the frequency response of the filter.

19 Claims, 17 Drawing Sheets

(56) References Cited

U.S. PATENT DOCUMENTS

| | | | |
|---|---|---|---|
| 5,083,101 A | | 1/1992 | Frederick |
| 5,227,365 A | * | 7/1993 | Van den Sype ........ C04B 35/45 252/509 |
| 6,825,748 B1 | | 11/2004 | Ibata et al. |
| 7,456,702 B2 | | 11/2008 | Keefe et al. |
| 8,008,991 B2 | | 8/2011 | Tcaciuc et al. |
| 8,159,313 B2 | | 4/2012 | Uchaykin |
| 8,279,022 B2 | | 10/2012 | Thom et al. |
| 8,441,329 B2 | | 5/2013 | Thom et al. |
| 8,745,850 B2 | | 6/2014 | Farinelli et al. |
| 9,300,029 B2 | | 3/2016 | Abraham et al. |
| 2008/0284545 A1 | | 11/2008 | Keefe et al. |
| 2011/0183853 A1 | * | 7/2011 | Thom ...................... H01P 1/202 505/210 |
| 2012/0088675 A1 | * | 4/2012 | Pires ....................... H01P 1/202 505/210 |
| 2017/0178018 A1 | | 6/2017 | Tcaciuc et al. |

OTHER PUBLICATIONS

Fukushima, A. et al., "Attenuation of Microwave Filters for Single-Electron Tunneling Experiments," IEEE Transactions on Instrumentation and Measurement, 46(2):289-293, 1997.

Masluk, N., "Reducing the Losses of the Fluxonium Artificial Atom," Dissertation Presented to the Faculty of the Graduate School of Yale University, 2012, 223 pages.

Milliken, F.P. et al., "50 Ω Characteristic Impedance Low-Pass Metal Powder Filters," Review of Scientific Instruments vol. 78, 2007, 6 pages.

Naaman, O. et al., "On-Chip Josephson Junction Microwave Switch," arXiv:1512.01484v1 [cond-mat.supr-con] Dec. 4, 2015, 10 pages.

Santavicca, D.F. et al., "Impedance-Matched Low-Pass Stripline Filters," arXiv:0802.1343 [physics.ins-det] 2008, 9 pages.

Wollack, E.J. et al., "Impedance Matched Absorptive Thermal Blocking Filters," arXiv:1403.2909v1 [astro-ph.IM] Mar. 12, 2014, 5 pages.

Yeap, K.H. et al., "Attenuation in Superconducting Circular Waveguides," Advanced Electromagnetics vol. 5, No. 2, Sep. 2016, 5 pages.

* cited by examiner

SYSTEMS AND DEVICES FOR FILTERING ELECTRICAL SIGNALS

FIELD

The present systems and devices generally relate to devices for filtering electrical signals and particularly relate to coaxial filters containing superconductive material to dissipate high frequency signals.

BACKGROUND

Refrigeration

A superconducting material may generally only act as a superconductor if it is cooled below a critical temperature that is characteristic of the specific material in question. For this reason, those of skill in the art will appreciate that an electrical system that implements superconducting components may implicitly include a refrigeration system for cooling the superconducting materials in the system. A dilution refrigerator is an example of a refrigeration system that is commonly implemented for cooling a superconducting material to a temperature at which it may act as a superconductor. The cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems and devices are not limited to applications involving dilution refrigerators, but rather may be applied using any type of refrigeration system.

Metal Powder Filters

A typical metal powder filter employs a hollow conductive housing having an inner volume that is filled with a mixture of metal powder and epoxy. A portion of a conductive wire extends through the inner volume of the housing such that the portion of the conductive wire is completely immersed in the metal powder epoxy mixture. The particles of the metal powder are conductive and together provide a very large surface area over which high frequency signals carried on the conductive wire are dissipated via skin-effect damping.

Conventionally, the metal powder is a normal metal powder, or is a metal powder in a normal state. A normal metal is a non-superconducting metal. A metal in a normal state is non-superconducting.

U.S. Pat. No. 8,008,991 describes, for example, a cylindrical tubular geometry enclosure where the conductive wire is enclosed by the enclosure which contains the metal powder epoxy mixture. The filter comprises a dielectric substrate that extends longitudinally through enclosure and a portion of the conductive wire is wound about the dielectric substrate. Other variants of metal powder filters of the coaxial-type are described in U.S. Pat. Nos. 8,441,329, 8,159,313, and 9,231,181 and a variant employing non-circular cross-sectional geometries and off-axis inner conductive wire arrangements is described, for example, in U.S. Pat. Nos. 8,346,325 and 8,670,809.

While filters based on printed circuit boards (PCB) for input/output systems are modular in design, for example, those described in U.S. Pat. No. 8,405,468, metal powder filters have particular utility in superconducting applications, such as in the input/output system providing electrical communication to/from a superconducting computer processor. For example, a multi-filter assembly is employed for this purpose in U.S. Pat. No. 8,441,329. The multi-filter assembly includes a single conductive volume through which multiple through-holes are bored to provide a set of longitudinal passages. Each filter is realized by a respective coiled conductive wire extending through each passage, where the volume of each passage is filled with a mixture of metal powder and epoxy. Versions of this design that employ single-ended signaling are described in U.S. Pat. No. 8,008,991 while version of this design that are adapted to employ differential signaling are described in U.S. Pat. No. 8,279,022.

Shielding and Noise

Magnetic fields produced by external sources may cause unwanted interactions with devices in the integrated circuit. Accordingly, there may be a need for a superconducting shield proximate to devices populating the integrated circuit to reduce the strength of interference such as magnetic and electrical fields.

Superconducting shielding incorporated into an integrated circuit has been used to protect superconducting quantum interference device (SQUID) packages from DC and AC noise, such as magnetic and electrical fields, that would otherwise interfere with operation of the integrated circuit. Current flowing in superconducting wires has an associated magnetic field in the same manner as electrons flowing in normal metal wires. Magnetic fields can couple inductively to superconducting wires, inducing currents to flow. Quantum information processing with superconducting integrated circuits necessarily involves in wires, and hence associated magnetic fields.

Quantum properties of quantum devices that include superconducting integrated circuits are very sensitive to noise, and stray magnetic fields can negatively impact the quantum information processing properties of such circuits. A typical approach to reduce cross-talk and effects of electromagnetic radiation include implementing an on-chip superconducting switch such as a SQUID switch or cryotron switch. However, such approaches do not address sensitivity to magnetic components and trapped flux, and can dissipate noise as heat at transition temperatures.

Thus, there is a desire for techniques to isolate transmission lines, control lines, and superconducting components from electromagnetic radiation to reduce unwanted cross-talk and noise between devices in a superconducting integrated circuit.

BRIEF SUMMARY

A system comprising an electrical signal filtering device may be summarized as including a tubular outer conductor having an outer surface and an inner surface, and a longitudinal passage bounded by the inner surface of the tubular outer conductor, the longitudinal passage having a longitudinal center axis; an inner conductor having an outer surface, the inner conductor extending through the longitudinal passage in a direction parallel to the longitudinal center axis; and a dissipative matrix distributed in the longitudinal passage to occupy at least a portion of the volume defined by the inner surface of the tubular outer conductor and the outer surface of the inner conductor, wherein the dissipative matrix comprises a first material that is superconductive in a respective range of temperatures. The first material may be selected to tune a characteristic of a frequency response of the electrical signal filtering device. The characteristic of the frequency response of the electrical signal filtering device may be a cut-off frequency of the electrical signal filtering device.

The dissipative matrix may include at least one superconducting powder selected from the group consisting of a superconducting metal, a superconducting oxide, and a superconducting ceramic, the at least one superconducting powder comprising the first material. The at least one superconducting powder may have a particle size of the same order of magnitude as the London penetration depth of the first material. The dissipative matrix may include a normal metal powder, the normal metal powder including a coating, the coating comprising the first material. The normal metal powder may include at least one of a ferromagnetic and a paramagnetic material. The coating may have a thickness of the same order of magnitude as the London penetration depth of the first material. At least one of a) the inner surface of the tubular outer conductor, b) the outer surface of the tubular outer conductor, and c) the outer surface of the inner conductor may have a coating, the coating comprising the first material. The coating may have a thickness of the same order of magnitude as the London penetration depth of the first material. The tubular outer conductor may have a cross-sectional geometry that is non-circular. The inner conductor may include the first material. The inner conductor extending through the longitudinal passage may be collinear with the longitudinal center axis.

The system may further include a magnetic field generator which in operation applies a magnetic field to the dissipative matrix, the magnetic field selected to tune a characteristic of a frequency response of the electrical signal filtering device. The magnetic field generator may be an electromagnetic coil which in operation passes a current, the current selected to tune the characteristic of the frequency response of the electrical signal filtering device. The characteristic of the frequency response of the electrical signal filtering device may be a cut-off frequency of the electrical signal filtering device.

The dissipative matrix may further include at least one of a non-conductive ferromagnetic and non-conductive paramagnetic material.

A method of fabricating an electrical signal filtering device may be summarized as including providing a tubular outer conductor comprising a longitudinal passage bounded by an inner surface of the tubular outer conductor; positioning an inner conductor to extend through the longitudinal passage in a direction parallel to a longitudinal center axis of the longitudinal passage; and distributing a dissipative matrix in the longitudinal passage to occupy at least a portion of the volume defined by the inner surface of the tubular outer conductor and an outer surface of the inner conductor, wherein the dissipative matrix comprises a first material which is superconductive in a respective range of temperatures.

Positioning an inner conductor to extend through the longitudinal passage in a direction parallel to a longitudinal center axis of the longitudinal passage may include forming an assembly by inserting a first end of an inner conductor into a first receptacle that is fixed in a first coaxial connector; soldering the first end of the inner conductor to the first receptacle that is fixed in the first coaxial connector; inserting a second end of the inner conductor into a second receptacle; soldering the second end of the inner conductor to the second receptacle; inserting the assembly into the volume defined by the inner surface of the tubular outer conductor and the outer surface of the inner conductor; fastening the first coaxial connector to a first end of the tubular outer conductor; and then fastening a second coaxial connector to a second end of the tubular outer conductor such that the second receptacle is concurrently inserted into the second coaxial connector. Distributing the dissipative matrix in the longitudinal passage may include injecting the dissipative matrix into the longitudinal passage and rotating the electrical signal filtering device while the dissipative matrix is curing.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

Figure 1:
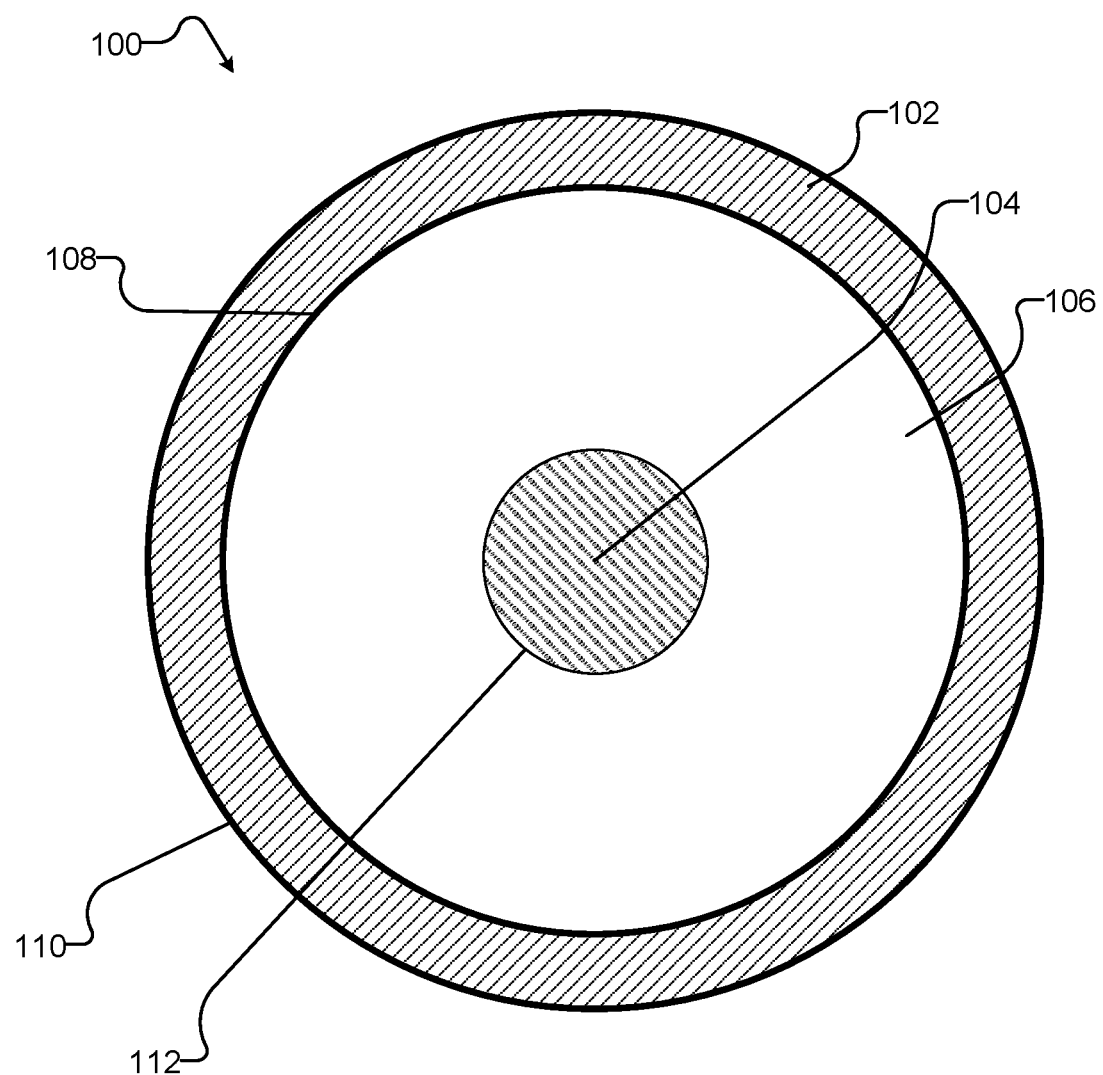
FIG. 1 is a sectional view of an example coaxial metal powder filter.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with electrical filters, such as input/output terminals and connectors, solder joints, and input/output wiring have not been shown or described in detail to avoid unnecessarily obscuring descriptions of the embodiments of the present systems and devices.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to an electrical filter including "an inner conductor" includes a single inner conductor, or two or more inner conductors. It should also be noted that the term "or" is generally employed in its sense including "and/or" unless the content clearly dictates otherwise.

The headings provided herein are for convenience only and do not interpret the scope or meaning of the embodiments.

In some implementations, superconducting devices operate at cryogenic temperatures. The cryogenic temperatures may be less than 100 mK. The devices can be communicatively coupled to other devices or electronics operating within the cryostat or outside the cryostat at room temperature. The communicative coupling between the superconducting devices and the other devices or electronics can be via a number of electrical connections. In some implementations, the electrical connections can be one or more bias lines and/or microwave readout lines connecting the superconducting devices to biasing and/or readout electronics.

If unmitigated, the impact of undesired radiation coupling between devices can have a significant impact on system performance. The power radiated down a bias line to a device in a typical cryostat can be of order 0.1 pW.

There are several approaches to designing and building filters that can block undesirable microwave thermal radiation. Some of these are dissipative approaches based on distributed lossy microwave structures that provide a broadband low-pass transmission response. Other approaches may aim to provide a well-defined impedance match using, for example, at least one of coaxial lines, stripline, and powder filters. Filters having a desirable attenuation at high frequencies can have significant undesirable attenuation in the pass-band. For example, some filters have an undesirable attenuation in the pass-band of more than 20 dB at 10 GHz.

The frequency response of a filter is a plot of signal attenuation versus frequency. Characteristics of the frequency response may include a pass-band, a stop-band, a cut-off frequency and a corner frequency. The pass-band of a filter is the range of frequencies that can pass through the filter. Signal attenuation is typically low, or close to 0 dB, in the pass-band. The stop-band of a filter is the range of frequencies that the filter does not allow to pass. Signal attenuation is typically high in the stop-band so that signals in this range will dissipate. For a low-pass filter, the cut-off frequency is a characteristic of the frequency response that defines the end of the pass-band. The cut-off frequency is the frequency at which attenuation begins to increase as the pass-band transitions into the stop-band. For a low-pass filter, the corner frequency of a filter is the frequency at which high signal attenuation begins and defines the end of a transition range between the pass-band and the stop-band. As frequency increases in the stop-band, attenuation may gradually decrease. It is therefore desirable to develop a filter where one can maximize attenuation in the stop-band without any attenuation in pass-band.

Typically, filters that use normal metal powder in the dissipative matrix will have undesirable attenuation in the pass-band below the cut-off frequency. Examples of normal metals used in powder filters include copper, bronze, brass, and stainless steel. Using a higher ratio or more than one type of normal metal powder in the dissipative matrix of a coaxial filter to increase attenuation above the cut-off frequency can result in unfavorable attenuation below the filter cut-off frequency in the pass-band. That is, with a conventional normal metal powder filter, it is difficult to tune the cut-off and corner frequencies of a normal metal powder filter.

For some applications, it can be advantageous to design a low-pass filter with a desired characteristic impedance, a cut-off frequency range of 1 GHz to 15 GHz, less than 0.5 dB attenuation in the pass-band of the low-pass filter, and more than 40 dB attenuation above a frequency of 100 GHz in the stop-band. It can be advantageous for the cut-off frequency to be tunable to a desired value. It can also be advantageous for the filter to be capable of operating at cryogenic temperatures as low as 10 mK, and for the filter to be manufactured properly by a straightforward process.

One approach to designing such a filter is to use a dissipative matrix that contains superconductive material. The superconductive material may be in the form of superconductive powder particles or normal metal powder particles that are coated with a superconductive layer. The superconductive material may comprise at least one of a superconducting metal, oxide, ceramic, and organic material. Examples of superconductive material include at least one of zinc, aluminum, niobium, titanium, tin, and lead. In one implementation, the dissipative matrix includes a mixture of superconductive powder and normal metal powder particles coated in superconductive material. In another implementation, the normal metal powder particles that have a superconductive coating can be conductive and/or magnetic. The dissipative matrix can also include an epoxy. The approach is typically used in a coaxial filter but can be used in combination with stripline or microstrip filter embodiments, or with another suitable filter embodiment.

An intrinsic property of a superconductive material is critical temperature $T_C$ which is the temperature at which the electrical resistivity of the material drops to zero (i.e., temperature at which it becomes superconductive). Energy gap frequency $F_g$ is another property of superconductive material that depends on critical temperature $T_C$, the Boltzmann constant k, and the Plank constant h as shown by equation 1 below:

$$F_g = \frac{7kT_C}{2h} \quad (1)$$

The energy gap frequency can be exploited to adjust a characteristic of the frequency response (e.g., cut-off frequency) of a coaxial powder filter containing superconductive material when the filter is operated at a critical temperature. For example, one can adjust the cut-off frequency of a coaxial powder filter containing zinc in its dissipative matrix when the filter is operated at less than 0.85 K. The critical temperature for zinc is 0.85 K and its corresponding energy gap frequency is approximately 60 GHz. Thus, by implementing zinc in the dissipative matrix, the coaxial powder filter can achieve very low attenuation (e.g., close to 0 dB) at frequencies below approximately 60 GHz due to superconductive properties (i.e., zero electrical resistivity) while achieving high attenuation at frequencies above 60 GHz. High attenuation above the energy gap frequency is a result of high frequency signals breaking apart Cooper pairs which causes superconductive material to behave like normal metals.

In some cases, energy gap frequency can be exploited to tune a characteristic of the frequency response (e.g., cut-off frequency) of a coaxial powder filter containing superconductive material by applying an external magnetic field. Typically, applying an external magnetic field to a filter containing superconductive material results in extreme undesired attenuation in the pass-band. However, for superconductive material with a thickness or particle size on the same order of magnitude as the London penetration depth of the material, the cut-off frequency for a filter can be tuned with an external magnetic field to achieve high attenuation in the stop-band with low or no attenuation in the pass-band. The thickness or particle size of superconductive material may fall within a range of $\lambda\sqrt{5} < d < 8\lambda$ where d is thickness or particle size and $\lambda$ is the London penetration depth. The relationship between energy gap and magnetic field for a superconductive material with thickness $d = \lambda\sqrt{5}$ is described in "Magnetic field dependence of the superconducting energy gap" by Douglass, D. H. (1961). This relationship may be used in determining the size of superconductive powder particles or the thickness of superconductive coating layers so that cut-off frequency can be tuned.

In general, energy gap frequency, and accordingly cut-off frequency, decreases as magnetic field increases. This dependency provides an advantage in superconductive filter design because the cut-off frequency can be controlled by applying an external magnetic field to the superconductive material through a magnetic field generator, for example, an electromagnetic coil. As a result, this widens the selection of superconductive materials that may be used in the filter to achieve a desired cut-off frequency and pass-band range. For example, a coaxial filter may have a dissipative matrix comprising aluminum which, at a critical temperature of 1.18 K, has an energy gap frequency of 86 GHz. If the desired cut-off frequency for the filter is, for example, 60 GHz, one may apply an external magnetic field to the aluminum particles to shift the energy gap frequency and accordingly the cut-off frequency to 60 GHz.

Another example of how energy gap frequency can be used to control attenuation in a metal powder filter is to add magnetic materials to a dissipative matrix that contains superconductive material. As described in "Fundamentals of Superconductivity" by Kresin V. and Wolf S. (2013), magnetic materials can partially break up Cooper pairs by flipping the magnetic moment of one electron of the pair. The broken bound state consequently lowers the energy gap and the energy gap frequency but the superconductive material maintains zero electric resistivity (i.e., the material remains superconductive). The energy gap frequency and accordingly the corner frequency of a superconducting filter can therefore be tuned by adding an appropriate concentration of either paramagnetic or ferromagnetic materials to the dissipative matrix. Magnetic materials may be selected based on an appropriate saturation index and/or permeability.

In one implementation, the dissipative matrix may include paramagnetic or ferromagnetic normal metal powder particles that are coated with superconductive material. In this case, the magnetic normal metal powder may be conductive. In other implementations, the dissipative matrix may include superconductive material that was melted, mixed with paramagnetic or ferromagnetic materials, then solidified and powdered. The dissipative matrix may alternatively or additionally include superconductive material that is doped with paramagnetic or ferromagnetic impurities. In these cases, the magnetic portion of the superconductive/magnetic alloy may be non-conductive. In variations of the above implementations, the dissipative matrix may also include an epoxy.

In the case that paramagnetic materials are added, a magnetic field generator may be used to induce an external magnetic field to lower the energy gap frequency. For example, a solenoidal electromagnetic coil can be wrapped around the outer tubular conductor of a superconductive filter containing paramagnetic materials to lower the energy gap frequency.

Energy gap frequency generally has an inverse relationship with the concentration of magnetic materials. In some cases, it may be advantageous to have a concentration of magnetic materials in the dissipative matrix of a superconductive filter to achieve a pass band range of 1 to 15 GHz and cut-off frequency of less than 15 GHz.

For some applications, it can be beneficial to cover superconductive surfaces with a very thin resistive layer to achieve higher attenuation in the stop-band. The thin electrically resistive layer may be obtained by oxidation of particles of the superconductive material covering the surface. For example, if material forming the superconductive surface comprises titanium, the thin resistive layer may comprise titanium oxide formed from oxidation of titanium particles. Titanium oxide is a resistive material and oxidation is an effective method for growing thin resistive layers. Other examples of materials that can form resistive layers include zinc oxide, aluminum oxide, niobium oxide, tin oxide, lead oxide, or a combination thereof. Surfaces of a coaxial filter that may be covered with a thin resistive layer include the inner conductive wire, inner surface of the outer tubular conductor, or surfaces of powder particles comprising superconductive material.

FIG. 1 is sectional view of an example coaxial metal powder filter 100. Metal powder filter 100 employs a tubular geometry and includes a cylindrical outer conductive housing 102 and an inner conductive wire 104 that is arranged coaxially therein. The outer conductive housing has an inner surface 108 and an outer surface 110. The cylindrical volume 106 defined between the inner surface of the outer conductive housing 102 and the outer surface of the inner conductive wire 112 is filled with a mixture that can include a dissipative matrix.

Conventionally, the dissipative matrix can include a normal (non-superconducting) metal powder such as a powder of copper, brass, bronze, or stainless steel. Signal attenuation can be caused by the presence of eddy currents induced in the conductive particles of the metal powder. Typically, a normal metal powder filter can provide a desired attenuation at high frequencies. Attenuation can be increased by: a) increasing the amount of metal powder in the dissipative matrix, b) decreasing the size of particles, and/or c) using materials with high resistivity. A shortcoming of the normal metal filter is that there can be an undesirable attenuation at low frequencies. Increasing attenuation at high frequencies can cause unwanted increased attenuation at lower frequencies, particularly frequencies in the pass band of a low-pass filter.

The present application describes a coaxial metal powder filter in which the dissipative matrix includes a superconductive material (i.e., a material that is superconductive in a range of temperatures). In one implementation, the superconductive material includes a superconducting metal. In other implementations, the superconducting material includes superconducting oxide, ceramic, and/or organic material. In variations of the above implementations, the dissipative matrix can also include an epoxy and/or magnetic material. Normal metal particles or magnetic particles in the dissipative matrix may be coated with a layer of superconductive material. The particles may be further coated with a thin electrically resistive layer, for example, a resistive oxide layer obtained through oxidation of the layer of superconductive material. In some implementations, the inner surface of outer conductive housing 108 and the outer surface of inner conductor 112 are covered with superconductive material. Thickness of superconductive layers vary according to the cut-off frequency but is comparable to the material's London penetration depth (i.e., between √5 times and 8 times the London penetration depth). The dissipative matrix mixture has a dielectric constant E, the outer conductive housing 102 has an inner diameter x and the inner conductive wire 104 has a diameter y. As is well known in the art, the characteristic impedance Z of this coaxial geometry is given by equation 2:

$$Z = \frac{138}{\sqrt{E}} \log\left(\frac{x}{y}\right) \qquad (2)$$

In some applications of metal powder filters, it is desirable for the filter to be characterized by a specific impedance. The coaxial filter may be constructed with specific parameters for E, x, and y in order to achieve a specific impedance Z in accordance with equation 2. However, in some cases, it can be difficult to produce the precise coaxial alignment between the inner conductive wire 104 and the outer conductive housing 102 that is necessary in order to ensure that the characteristic impedance Z of the filter is accurately given by equation 2. In practical implementations, the inner conductive wire may be positioned off-axis inside the outer conductive housing. For example, in U.S. Pat. No. 8,670,809, the inner conductive wire is deliberately positioned off-axis to remove the challenge of precise alignment and the impedance calculation accounts for the off-axis distance.

Altering the dissipative matrix is an effective method for controlling a coaxial filter's frequency response but the geometry of a coaxial tubular filter can also have a significant effect. In particular, the cut-off frequency $f_c$ of the coaxial filter can be inversely proportional to a dielectric constant $\varepsilon_R$, an inner diameter of the outer tubular conductor $D_d$ and a diameter of the inner conductive wire $D_c$ according to equation 3:

$$f_c = \frac{11.8}{\sqrt{\varepsilon_R}\pi\left(\frac{D_d + D_c}{2}\right)} \qquad (3)$$

It can therefore be advantageous to select the diameters of the inner and outer conductors to further increase attenuation above the cut-off frequency. However, it is important to select the diameters carefully as diameters that are too large may reduce the cut-off frequency to a value that is below the desired value. This can potentially lead to unwanted attenuation in the pass-band. Additionally, one may choose to manipulate the dielectric constant to offset the decreased cut-off frequency caused by large diameter sizes. This can be done by using materials with relatively smaller dielectric constants in the dissipative matrix. Conversely, for small diameter sizes, the dielectric constant can be increased by increasing the ratio of powder to epoxy in the dissipative matrix to further increase attenuation above the desired cut-off frequency.

Figure 2:
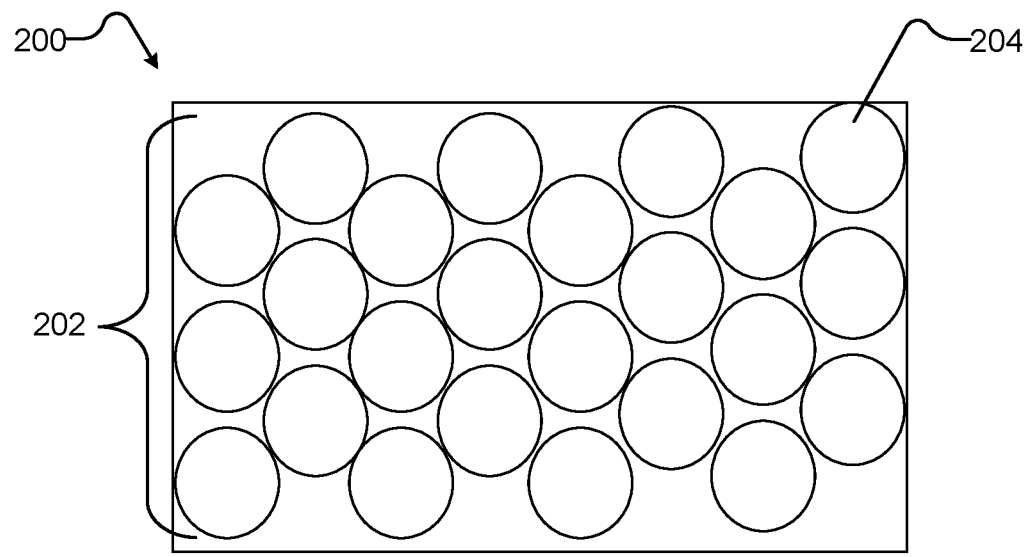
FIG. 2 is a sectional view of an example dissipative matrix comprising a superconducting powder that includes superconducting metal.

FIG. 2 shows an example dissipative matrix 200 that fills the volume of a coaxial metal powder filter (e.g., filter 100 of FIG. 1). Dissipative matrix 200 may comprise a superconducting powder 202 that includes superconducting metal 204. Superconducting metal particles 204 may be non-uniform in shape and size. Dissipative matrix 200 may further include an epoxy.

Figure 3:
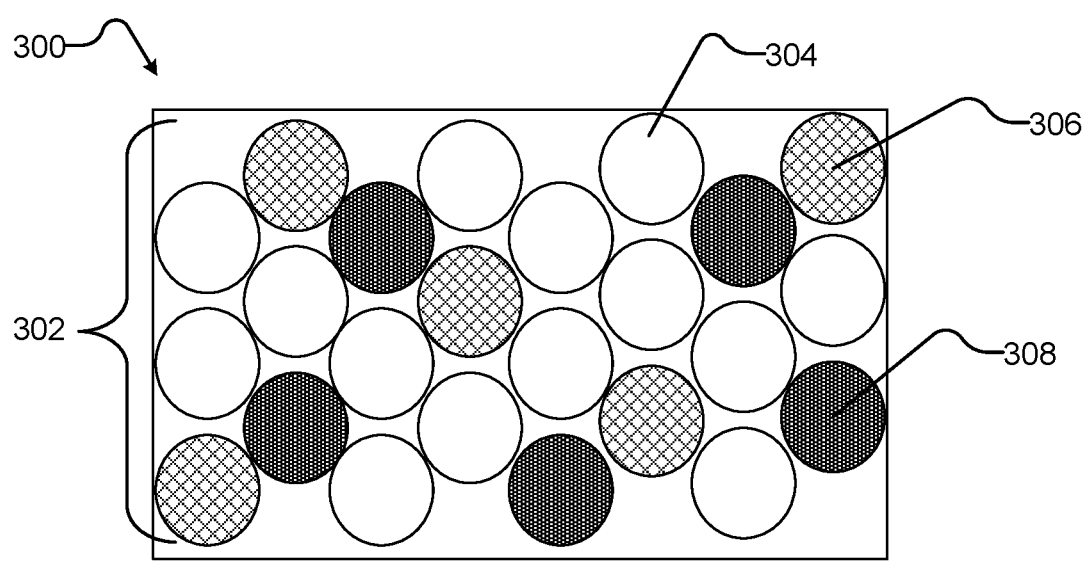
FIG. 3 is a sectional view of an example dissipative matrix comprising a superconducting powder that includes superconducting metal, superconducting oxide, and superconducting ceramic.

FIG. 3 shows an example dissipative matrix 300 that fills the volume of a coaxial metal powder filter (e.g., filter 100 of FIG. 1). Dissipative matrix 300 may comprise a superconducting powder 302 that includes at least one of a superconducting metal 304, a superconducting oxide 306, and a superconducting ceramic 308. The number of particles of superconducting metal 304, superconducting oxide 306, and superconducting ceramic 308 may be proportioned to tune a characteristic of a frequency response such as cut-off frequency. Particles of superconducting metal 304, superconducting oxide 306, and superconducting ceramic 308 may be non-uniform in shape and size. Dissipative matrix 300 may further include an epoxy.

Figure 4:
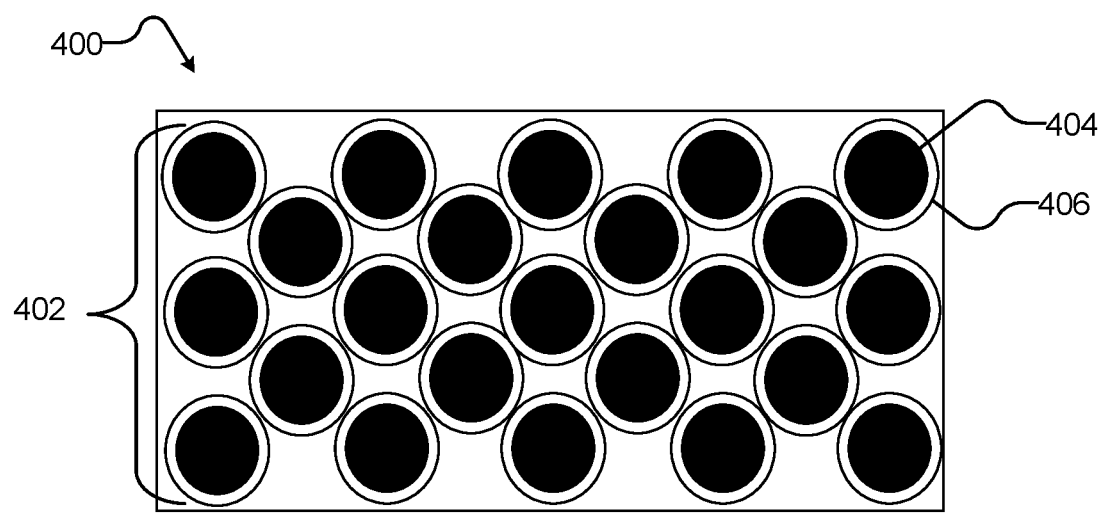
FIG. 4 is a sectional view of an example dissipative matrix comprising a normal metal powder that includes normal metal particles having a superconductive coating.

FIG. 4 shows an example dissipative matrix 400 that fills the volume of a coaxial metal powder filter (e.g., filter 100 of FIG. 1). Dissipative matrix 400 may comprise a normal metal powder 402 that includes normal metal particles 404. Normal metal particles 404 may have a coating 406 that is superconductive. The thickness of superconductive coating 406 is of the same order of magnitude as the London penetration depth of the material that comprising coating 406. Normal metal particles 404 and coating 406 may be non-uniform in shape and size. Dissipative matrix 400 may further include an epoxy.

Figure 5:
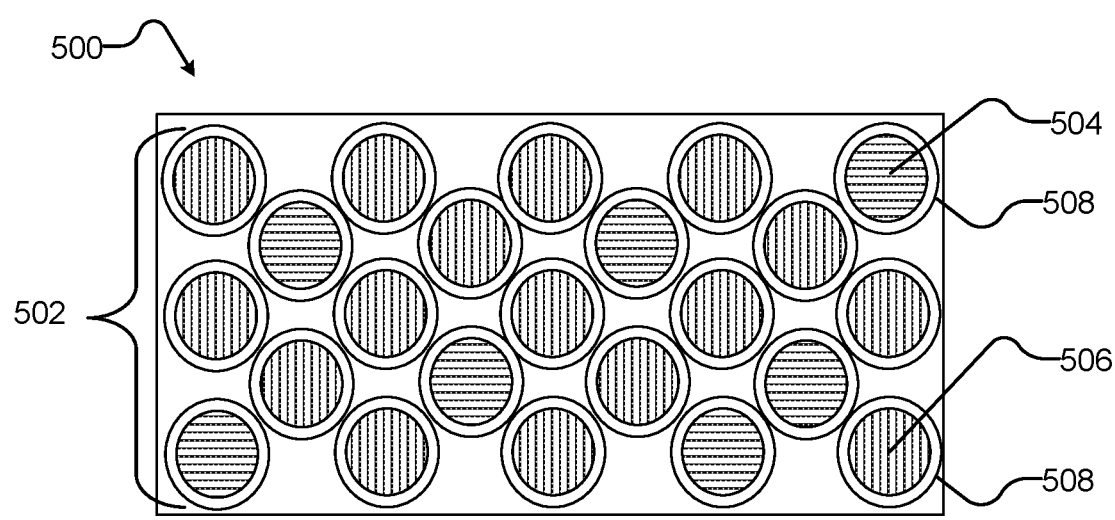
FIG. 5 is a sectional view of an example dissipative matrix comprising a normal metal powder that includes ferromagnetic and paramagnetic material.

FIG. 5 shows an example dissipative matrix 500 that fills the volume of a coaxial metal powder filter (e.g., filter 100 of FIG. 1). Dissipative matrix 500 may comprise a normal metal powder 502 that includes at least one of a ferromagnetic material 504 and a paramagnetic material 506. Particles of ferromagnetic material 504 and paramagnetic material 506 may have a coating 508 that is superconductive. The thickness of superconductive coating 508 is of the same order of magnitude as the London penetration depth of the material comprising coating 508. The number of particles of ferromagnetic material 504 and paramagnetic material 506 may be proportioned to tune a characteristic of a frequency response such as cut-off frequency. In some implementations, ferromagnetic material 504 and paramagnetic material 506 may be conductive. Particles of ferromagnetic material 504 and paramagnetic material 506 and coating 508 may be non-uniform in shape and size. Dissipative matrix 500 may further include an epoxy.

Figure 6:
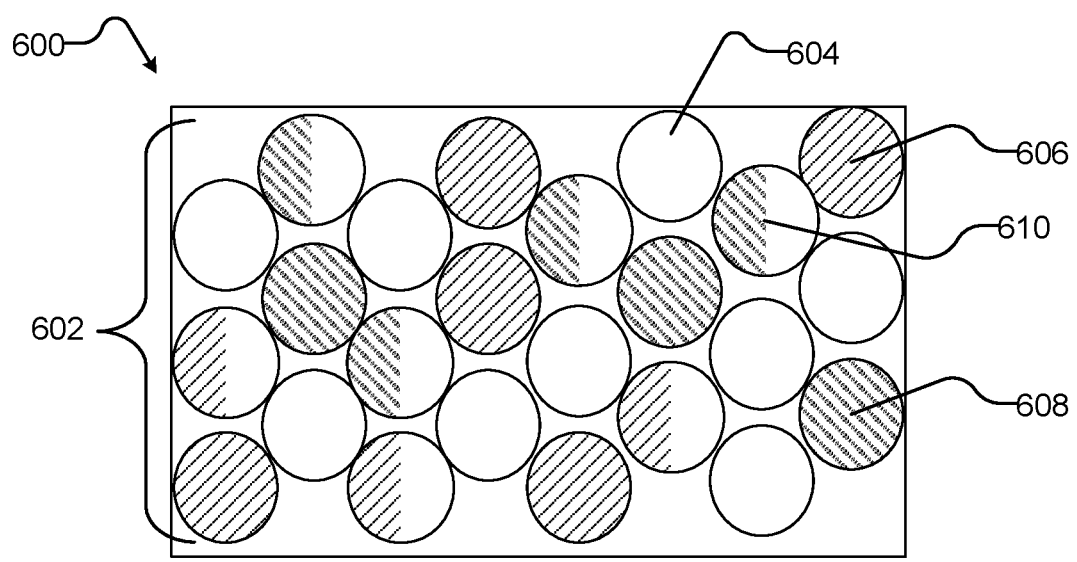
FIG. 6 is a sectional view of an example dissipative matrix comprising a powder that includes a superconducting powder, non-conductive paramagnetic material, and non-conductive ferromagnetic material.

FIG. 6 shows an example dissipative matrix 600 that fills the volume of a coaxial metal powder filter (e.g., filter 100 of FIG. 1). Dissipative matrix 600 may comprise a powder 602 that includes at least one of a superconducting powder 604, non-conductive paramagnetic material 608, and a non-conductive ferromagnetic material 606 such as a ferrite. Powder 602 may include superconductive/magnetic alloy particles 610 wherein the magnetic portion is a non-conductive ferromagnetic material 606 or non-conductive paramagnetic material 608. Superconducting powder 604 may comprise at least one of a superconducting metal, superconducting oxide, and a superconducting ceramic. Particles of superconducting powder 604, non-conductive paramagnetic material 608, non-conductive ferromagnetic material 606, and superconductive/magnetic alloy particles 610 may be non-uniform in shape and size. Dissipative matrix 600 may further include an epoxy.

Figure 7:
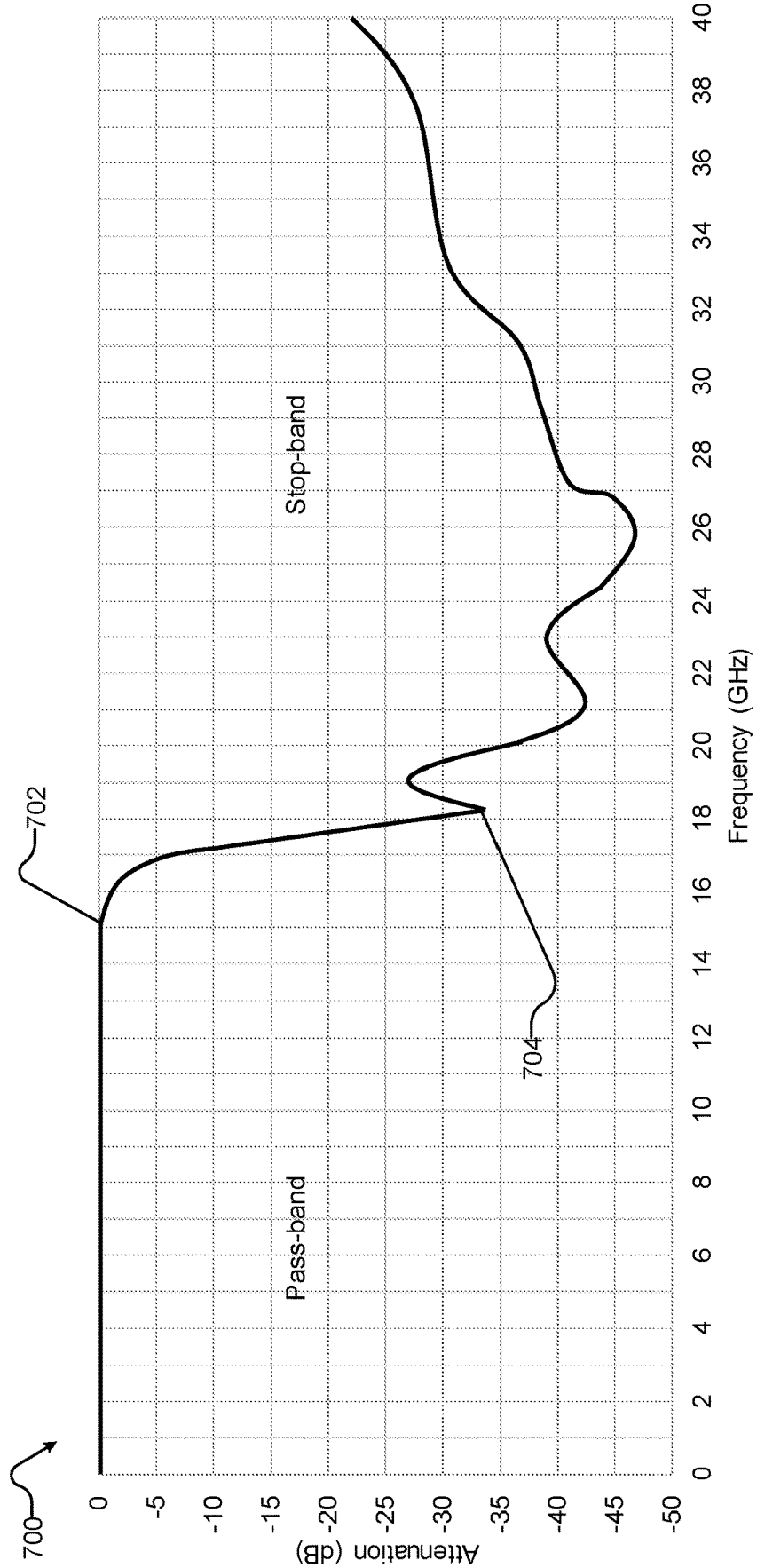
FIG. 7 is a graph illustrating the frequency response of an example low-pass coaxial powder filter.

FIG. 7 shows a graph 700 of an example frequency response of a low-pass coaxial powder filter. A cut-off frequency 702 depicted in graph 700 indicates the end of the pass-band range. The pass-band is between 0 to 15 GHz and attenuation is low or close to 0 dB within this range. Attenuation increases in the transition region (e.g., between 15 GHz to 18 GHz). A corner frequency 704 is approximately 18 GHz and indicates the beginning of the stop-band range where attenuation is high. However, attenuation diminishes as frequency increases in the stop-band which can affect the filter's performance. It is generally desirable to maintain high attenuation even at high frequencies within the stop-band.

Figure 8:
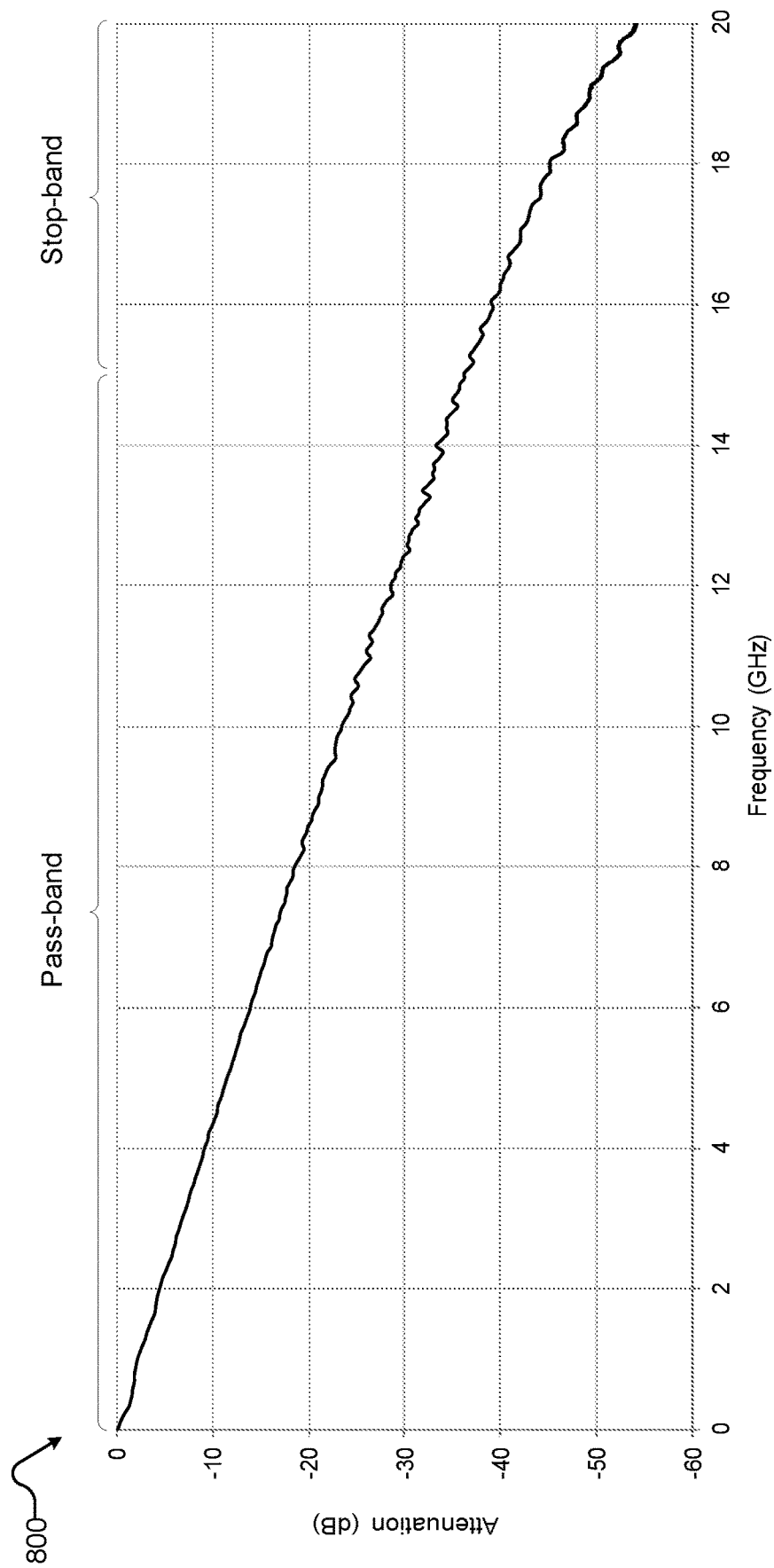
FIG. 8 shows a graph illustrating attenuation versus frequency for an example low-pass coaxial filter comprising normal metal powder operating at a cryogenic temperature.

FIG. 8 shows a graph 800 of attenuation versus frequency for an example low-pass coaxial filter comprising normal metal powder operating at a cryogenic temperature. In graph 800, the desired pass-band is between 0 to 15 GHz and the desired stop-band is above 15 GHz. There is undesirable attenuation in the pass-band (e.g., greater than 20 dB between 8 GHz to 15 GHz). Therefore, normal metal powder cannot be implemented to increase attenuation in the stop-band of graph 700 in FIG. 7 without also increasing attenuation in the pass-band.

Figure 9:
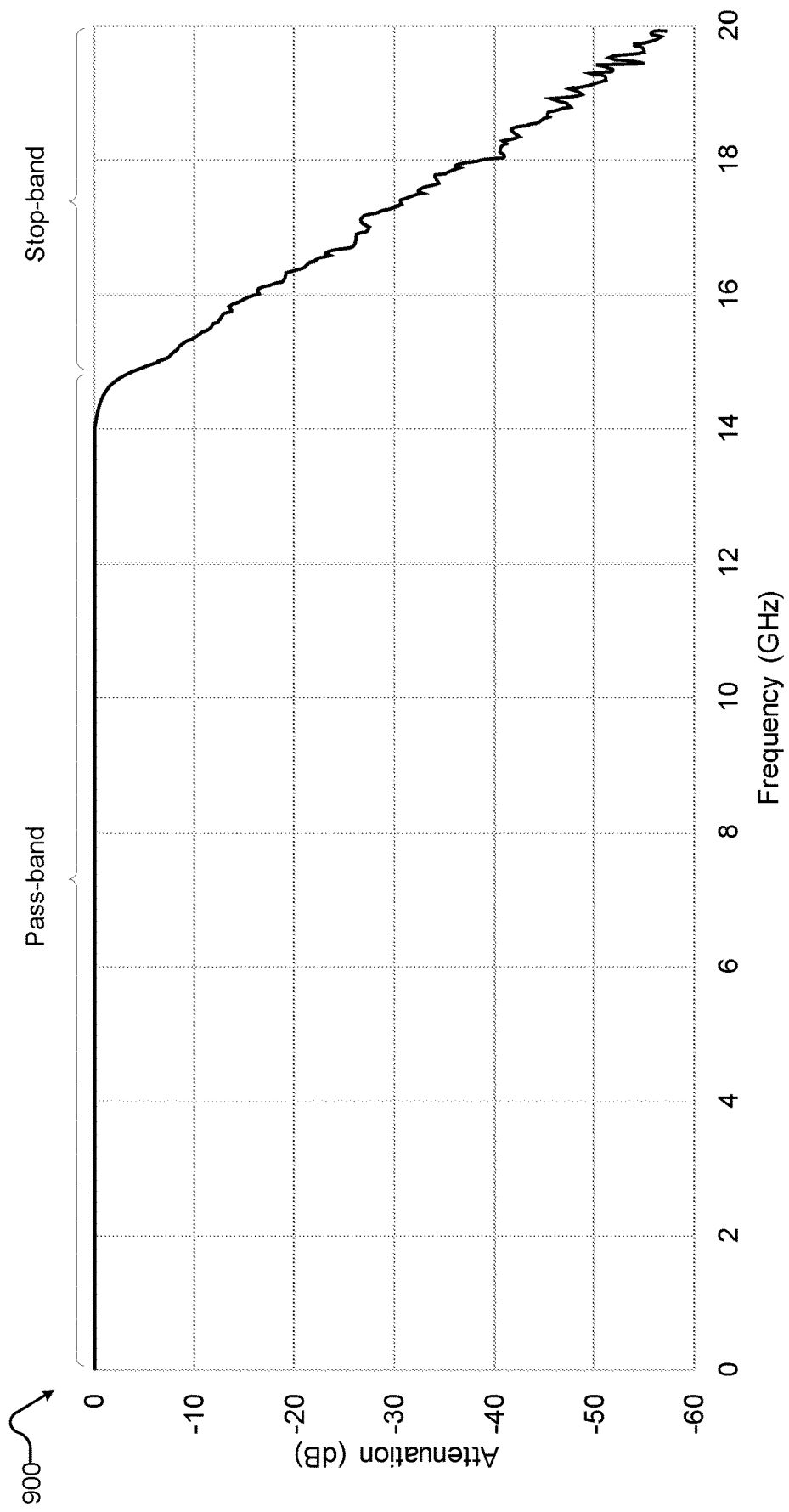
FIG. 9 is a graph illustrating attenuation versus frequency for an example low-pass coaxial filter comprising superconductive material operating at a critical temperature (e.g., cryogenic temperature).

FIG. 9 shows a graph 900 of attenuation versus frequency for an example low-pass coaxial filter comprising superconductive material operating at a critical temperature (e.g., cryogenic temperature). In graph 900, the desired pass-band is between 0 to 15 GHz and the desired stop-band is above 15 GHz. Due to zero electrical resistivity of the superconductive material in the filter, attenuation is close to 0 dB in the pass-band. Attenuation drastically increases in the stop-band above the energy gap frequency and accordingly the cut-off frequency (e.g., 15 GHz). Therefore, superconductive material can be implemented in a coaxial filter to increase attenuation in the stop-band of graph 700 in FIG. 7 without also increasing attenuation in the pass-band.

Figure 10:
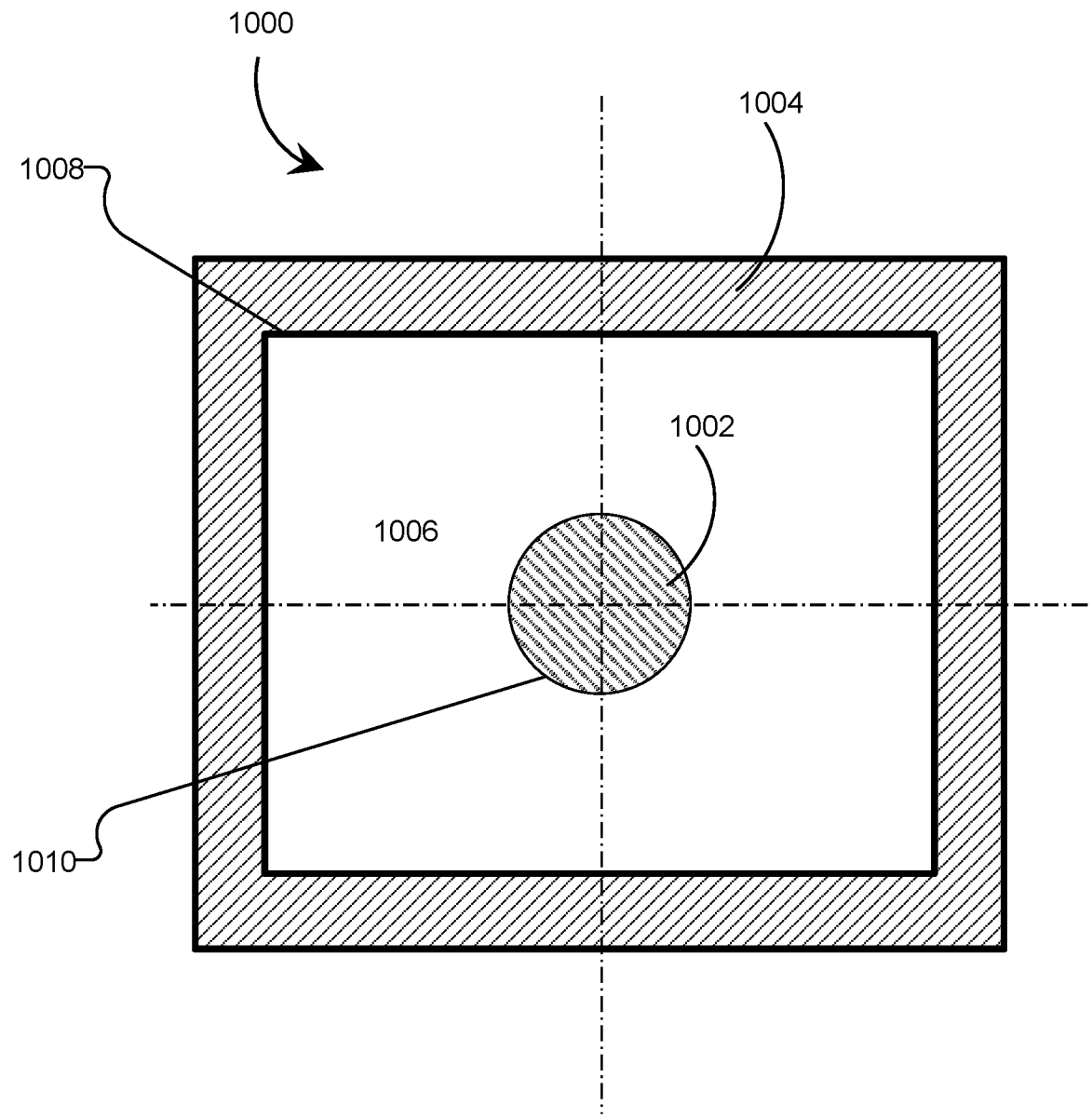
FIG. 10 is a sectional view of a tubular metal powder filter that employs a rectangular cross section according to an embodiment of the present systems and devices.

In some implementations, filters with non-circular geometries may be used in place a of a coaxial metal powder filter. FIG. 10 is a sectional view of a tubular metal powder filter 1000 that employs a rectangular cross section. Filter 1000 includes an inner conductive wire 1002 that extends within an outer conductive housing 1004, where the outer conductive housing 1004 has a geometry similar to that of a rectangular prism. Filter 1000 encloses a volume 1006 defined between the inner surface of the outer conductive housing 1008 and the outer surface 1010 of the inner conductive wire 1002. Volume 1006 is filled with a dissipative matrix that includes superconductive material in the form of superconducting metal particles or normal metal powder particles coated in a superconductive layer. In some implementations, the dissipative matrix can include a mixture of normal metal powder, superconductive material, magnetic material, and/or epoxy. In alternative implementations, filter 1000 may employ any non-circular cross sectional geometry. For example, filter 1000 may employ a triangular cross section, a pentagonal cross section, a hexagonal cross section, etc., or a trapezoidal cross section, a parallelogrammatic cross section, or another suitable cross section. In applications that implement multiple individual filters 1000, employing a cross section that includes at least one substantially flat outer edge may enable the filters to be packed together with better thermal contact inside a cryogenic refrigeration system.

The inner volume of filter 1000 comprises a longitudinal passage 1006 having a rectangular cross sectional geometry that matches the rectangular cross sectional geometry of outer conductive housing 1004. Passage 1006 is filled with a dissipative matrix comprising superconductive material and epoxy. The superconductive material may be superconducting metal particles or normal metal powder particles coated in a superconductive layer. In some implementations, the dissipative matrix may also include normal metal powder and/or magnetic material. In alternative embodiments, the cross-sectional geometry of the longitudinal passage 1006 may not be the same as the cross-sectional geometry of the outer conductive housing 1004. For example, longitudinal passage 1006 may have a circular cross sectional geometry within an outer conductive housing 1004 that has a rectangular cross-sectional geometry, or longitudinal passage 1006 may have a rectangular cross-sectional geometry within an outer conductive housing 1004 that has a circular cross-sectional geometry, and so on.

Each of the filter designs illustrated in FIG. 1 and FIG. 10 is particularly suited for applications involving single-ended signals. However, in accordance with the present systems and devices, each of the filter designs illustrated in FIG. 1 and FIG. 10 may be adapted to implement differential signaling.

Figure 11:
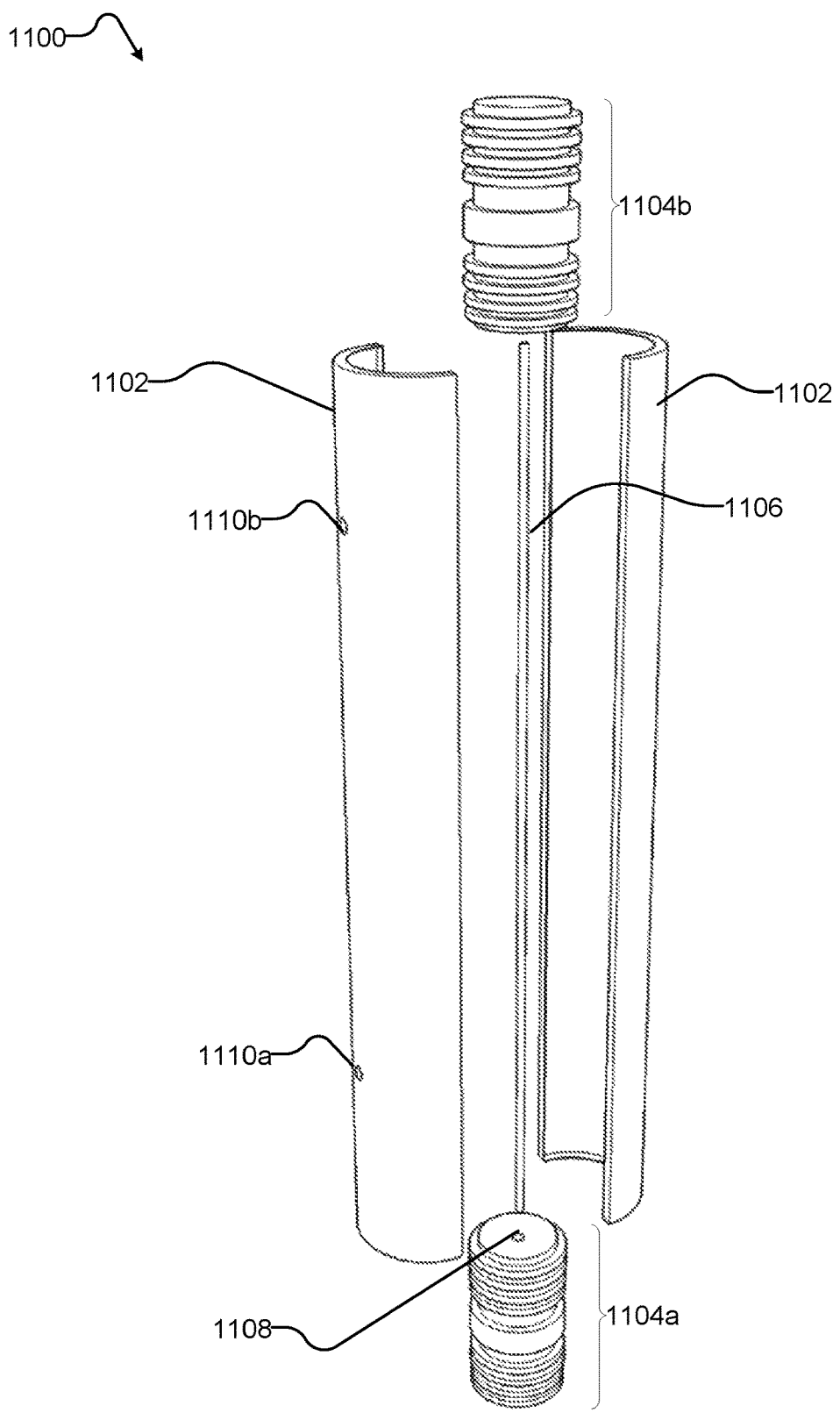
FIG. 11 is an exploded view of an example coaxial metal powder filter such as the filter illustrated in FIG. 1.

FIG. 11 is an exploded view of an example coaxial metal powder filter 1100. Fabrication of a coaxial metal powder filter (e.g., filter 100 of FIG. 1) according to the present systems and devices may first involve cutting a tubular outer conductor 1102 to a length sized to provide a desired attenuation. An inner surface of tubular outer conductor 1102 is threaded to screw coaxial connectors 1104a and 1104b (collectively 1104) at the distal ends. An example of a coaxial connector that may be used is an SMA adapter. Coaxial connectors 1104 have center receptacles 1108 (i.e., female ends, only one visible in FIG. 11) that can be separated from coaxial connectors 1104. The inner surface of tubular outer conductor 1102 can be covered with a superconductive material. Holes 1110*a* and 1110*b* (collectively 1110) can be drilled in tubular outer conductor 1102, and used to deposit a dissipative matrix (not shown in FIG. 8) in the interior volume of tubular outer conductor 1102, and to eliminate air bubbles in the dissipative matrix. An inner conductor 1106 can be soldered, or otherwise electrically coupled, to a receptacle 1108. Receptacles 1108 can be inserted into coaxial connectors 1104 to secure inner conductor 1106 in place along a longitudinal axis of tubular outer conductor 1102. Coaxial connectors 1104 can be screwed into and soldered to the tubular outer conductor 1102. Another suitable method of mechanical and electrically coupling of coaxial connectors 1104 and tubular outer conductor 1102 can be used. A dissipative matrix comprising superconductive material and epoxy can be injected through holes 1110, and filter 1100 can be rotated while epoxy in the dissipative matrix is curing to ensure homogeneity of the dissipative matrix within the interior volume of tubular outer conductor 1102. In some implementations, the dissipative matrix can include superconductive material, normal metal powder, magnetic material, and/or epoxy.

Figure 12:
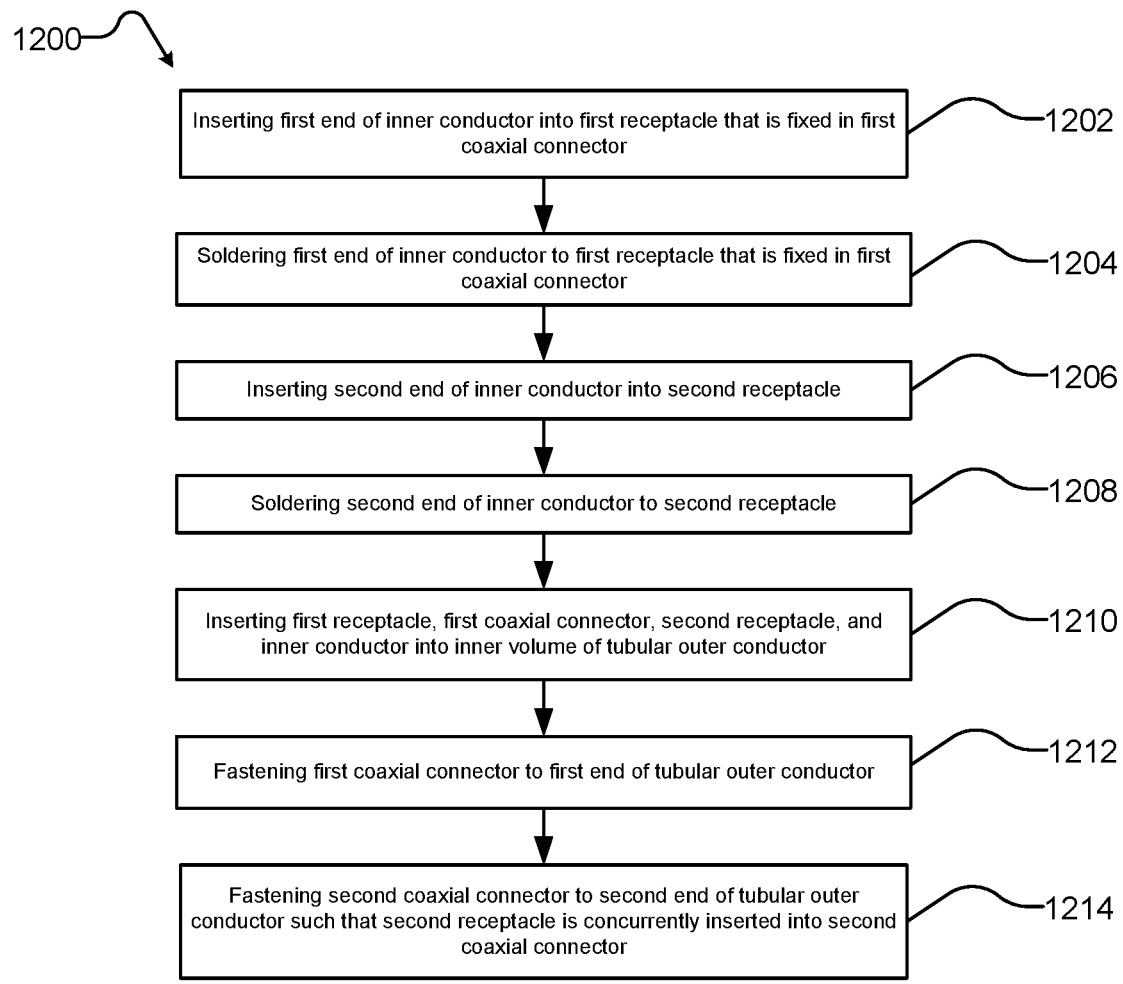
FIG. 12 is a flow diagram illustrating a process for fabricating a coaxial metal powder filter such as the filter illustrated in FIG. 1.

In some cases, it can be difficult to align an inner conductor with the longitudinal center axis of a tubular outer conductor when fabricating a coaxial metal powder filter. FIG. 12 shows a process 1200 for fabricating a coaxial metal powder filter. Process 1200 begins with inserting a first end of an inner conductor into a first receptacle that is fixed in a first coaxial connector at 1202. At 1204, the first end of the inner conductor is soldered to the first receptacle that is fixed in the first coaxial connector. At 1206, a second end of the inner conductor is inserted into a second receptacle. At 1208, the second end of the inner conductor is soldered to the second receptacle to complete forming an assembly. The assembly includes the first end of the inner conductor that is soldered to the first receptacle that, in turn, is fixed in the first coaxial connector and the second end of the inner conductor that is soldered to the second receptacle. At 1210, the assembly comprising the first receptacle, the first coaxial connector, the second receptacle, and the inner conductor is inserted into the inner volume of the tubular outer conductor. The inner volume is defined by the inner surface of the tubular outer conductor and the outer surface of the inner conductor. At 1212, the first coaxial connector is fastened to a first end of the tubular outer conductor. Next, at 1214, the second coaxial connector is fastened to the second end of the tubular outer conductor such that the second receptacle is concurrently inserted into the second coaxial connector. In one implementation, fastening the coaxial connector to the tubular outer conductor includes screwing and then soldering the coaxial connectors to the ends of the tubular outer conductor.

Figure 13:
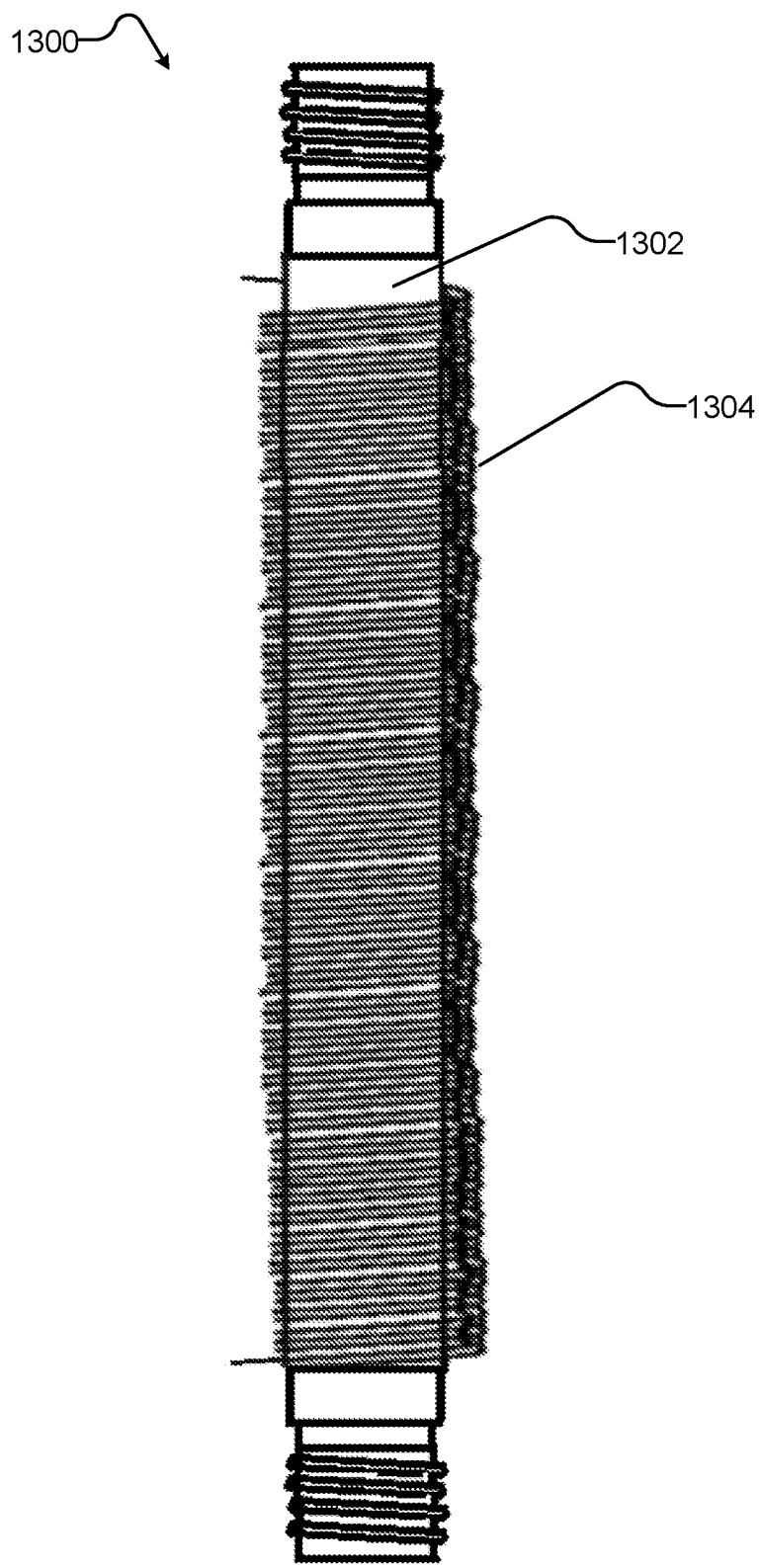
FIG. 13 is a top plan view of an example coaxial metal powder filter, such as the filter illustrated in FIG. 1, wherein the outer tubular conductor is wound by an electromagnetic coil.

FIG. 13 is a top plan view of an example coaxial metal powder filter 1300 wherein outer tubular conductor 1302 is wound by a magnetic field generator 1304. Magnetic field generator 1304 may be an electromagnetic coil. Outer tubular conductor 1302 may contain a dissipative matrix comprising superconductive material, normal metal powder, magnetic material, and/or epoxy. In some implementations, current may be sent through magnetic field generator 1304 to apply an external magnetic field to superconductive material or paramagnetic material in the dissipative matrix. An applied magnetic field may alter the energy gap frequency of superconductive material in the dissipative matrix, resulting in an adjusted cut-off frequency which is a characteristic of the frequency response of the filter. Inter-coil spacing, number of coil layers, and amount of current sent through magnetic field generator 1304 are based on the desired stop-band corner frequency. For example, a stronger current, additional coil layers, or smaller inter-coil spacing may result in a higher applied magnetic field which may decrease the energy gap frequency of the superconductive material and accordingly the cut-off frequency of the filter.

Figure 14:
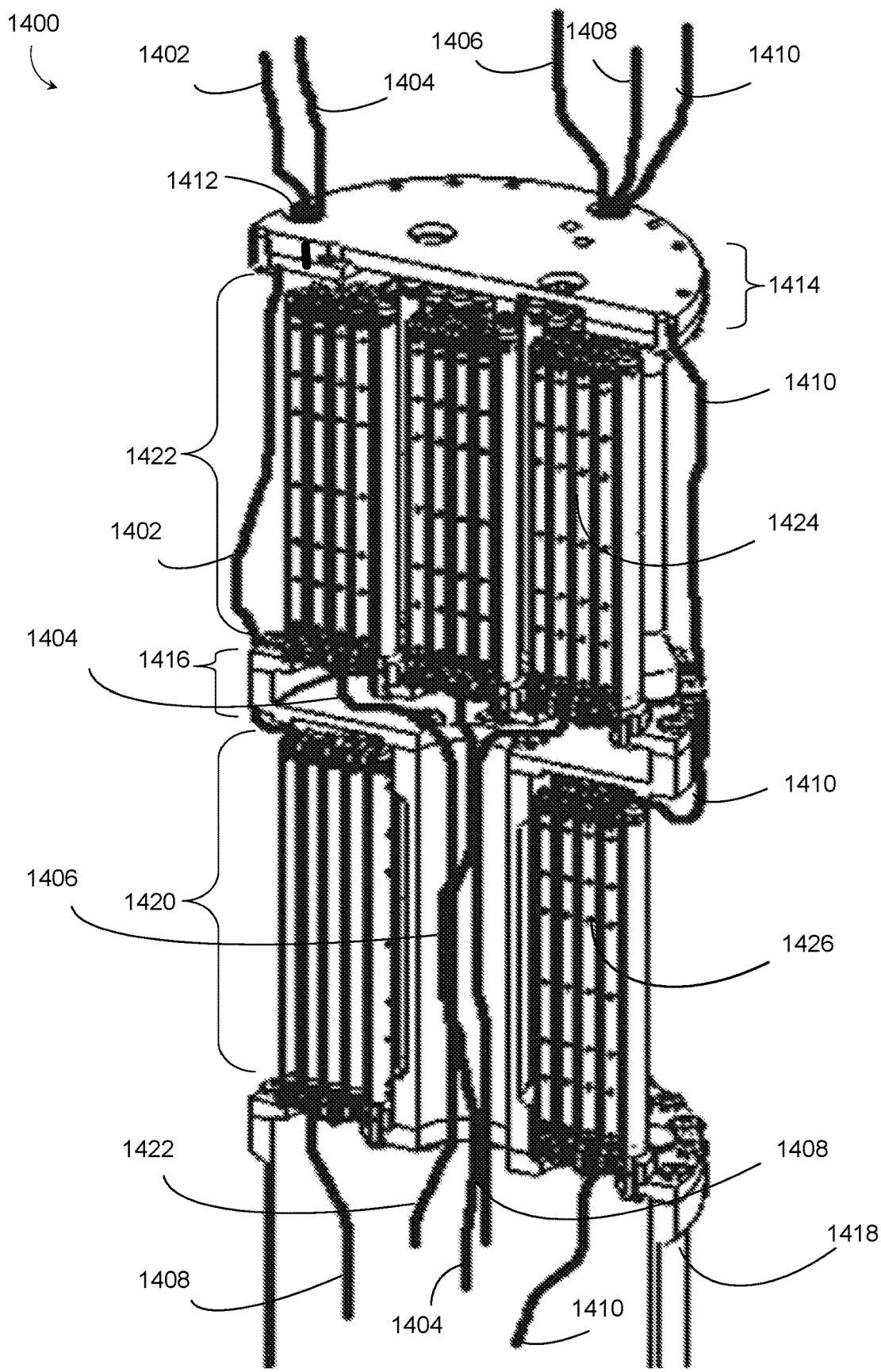
FIG. 14 is a cross-sectional view of input/output support structure showing example signal lines.

FIG. 14 is a cross-sectional view of input/output (I/O) support structure 1400 showing example signal lines 1402, 1404, 1406, 1408, and 1410. Signal line 1402 enters through a notch or groove 1412 in the side of top composite plate structure 1414. In some embodiments, I/O support structure 1400 may be tightly fit within a cylindrical magnetic shield and/or vacuum can such that the circumferential edge of each of composite plate structures 1414, 1416, and 1418 is flush against the sides of the cylindrical shield and/or vacuum can. In such embodiments, notches or grooves 1412 (only one called out in the FIG. 8) may be used as channels through which signal lines (e.g., signal lines 1402, 1404, 1406, and 1408) may enter/exit I/O support structure 1400.

Signal line 1402 carries a signal that is filtered in the second tier 1420 of I/O support structure 1400. From notch or groove 1412, signal line 1402 passes along the outside of first tier 1422. In some embodiments, signal line 1402 may physically contact an outer surface of at least one bundle 1424 in first tier 1422 for the purpose of thermalization and volume reduction. From first tier 1422, signal line 1402 may pass through a notch or groove in the circumferential edge of middle composite plate structure 1416, where filtered signals are shielded from outside noise. Signal line 1402 then enters an individual tubular filter structure in a bundle 1426 in second tier 1420. The signal(s) carried by signal line 1402 propagate through this individual tubular filter structure, where undesired signal frequencies are removed. Signal line 1402 then continues from the output of the individual tubular filter structure into shielded enclosure 1418. The path followed by signal line 1410 is generally similar to that followed by signal line 1402 except the signal line passes through a different notch or groove 1412 in top composite plate 1414 and middle composite plate structure 1416 and a different tubular filter structure in a different bundle 1426 in second tier 1420. The respective paths of signal lines 1402 and 1410 are illustrated as examples only, and through-holes may replace the notches or grooves. In practice, multiple signal lines may pass through the same notch or groove 1412.

A superconducting processor can include transmission lines that communicatively couple processor components such as qubits and digital-to-analog converters to room temperature electronics via input/output circuitry. Typically, it is desirable for transmission lines to be isolated from electromagnetic radiation. For example, transmission lines that operate at low frequencies (e.g., in the MHz range) may need to be isolated from high frequency electromagnetic radiation.

A typical approach to minimize the impact of electromagnetic radiation can include the use of a lumped element filter. However, a lumped element filter can be less effective for high frequency signals or applications that require narrow passbands. A lumped element filter may also be limited for shielding on-chip transmission lines.

One approach to shielding on-chip transmission lines in a superconducting processor is to implement a superconducting switch such as a Superconducting Quantum Interference Device (SQUID) switch or a cryotron switch. However, a SQUID switch can be sensitive to magnetic contaminants and trapped flux. An example of a SQUID switch is described in U.S. Application No. 62/680,824. Furthermore, a cryotron switch can be undesirable because it can dissipate noise as heat when a signal line transitions from a superconducting state to a non-superconducting state. As a result, operation of the superconducting processor can be disrupted. Therefore, it is desirable to have alternative approaches for isolating on-chip transmission lines in a superconducting processor from electromagnetic radiation.

In some cases, high frequency electromagnetic radiation can cause undesirable effects such as increased noise and crosstalk between signals carried in signal lines of the superconducting processor. Therefore, in some applications, a signal line may need to be shielded from high frequencies. In certain applications, some signal lines may need to be shielded from frequencies above 30 MHz in certain applications.

One method of isolating a signal line from electromagnetic radiation is to arrange a plurality of planar particles around the signal line. Each planar particle of the plurality of planar particles can have a size of less than 1000 nanometers. For example, each planar can have a width of less than 1000 nanometers and a length of less than 1000 nanometers. The signal line can be an on-chip transmission line or, in some cases, a coaxial line. The plurality of planar particles can have at least one particular property that can be exploited to isolate the signal line from electromagnetic radiation.

In one approach, a signal line is surrounded by a plurality of planar particles that are formed from a superconducting material so that the energy gap frequency of the superconducting material can be exploited. For example, it can be desirable for a signal line to carry a signal with a frequency in a passband range of 15-25 MHz. The plurality of planar particles can comprise a superconducting material that has an energy gap frequency that is approximately equal to or greater than the cutoff frequency of the passband (e.g., 25 MHz). In some cases, electromagnetic radiation can include signals of frequencies that are below the passband range and signals of frequencies that are above the passband range. Signals above the energy gap frequency (e.g., above 25 MHz) can be dissipated by the superconducting planar particles. In this regime, high frequency signals can induce larger eddy current losses than low frequency signals.

Another approach is to include a plurality of planar particles that are formed from a normal conductive material. Planar particles that comprise a normal conductive material can operate similarly to normal metal powder in conventional powder filters. High frequency signals can induce larger eddy current losses than low frequency signals.

Yet another approach is to include a plurality of planar particles that are formed from a semi-conductor material. A semi-conductor material has an electrical conductivity value that is between that of a conductor and an insulator. The bandgap of a semiconductor material is an intrinsic property and describes a region between the valence band (i.e., no electron flow) and the conduction band (i.e., free electron flow) of the semiconductor material. At an energy level below the band gap of the semiconductor material, the semiconductor material of the planar particles can cause an impedance mismatch resulting from changes in dielectric constant resulting in changes in capacitance per length. Thus, high frequency signals can be reflected back to an external source with zero dissipation. At an energy level above the bandgap, the semiconductor material becomes conductive and dissipative. This results in high frequency signals inducing larger eddy current losses than low frequency signals, thereby reducing electromagnetic radiation.

Each planar particle of the plurality of planar particles can be enclosed by a dielectric to avoid direct contact with other planar particles and the signal line. The plurality of planar particles surrounds the signal line without contact with the signal line. The plurality of planar particles can be sized to integrate with existing lithographic and/or integrated circuit fabrication techniques. For example, each planar particle of the plurality of planar particles can have a width of 250 nm and a length of 250 nm. Such as size of a planar particle can be achieved through photolithographic techniques such as chemical vapor deposition, chemical-mechanical polishing, wet etching, and dry etching. Alternatively, the plurality of planar particles can include planar particles of a range of sizes. In one implementation, each planar particle of the plurality of planar particles is positioned randomly. In other implementations, each planar particle of the plurality of planar particles can be positioned in an ordered array (e.g., a rectangular lattice). The size and arrangement of planar particles can be varied to achieve a desired cut-off frequency. One method of fabricating randomly arranged planar particle structures is described in the article "Speckle lithography for fabricating Gaussian, quasi-random 2D structures and black silicon structures" by Bingi and Murukeshan (2015).

Figure 15:
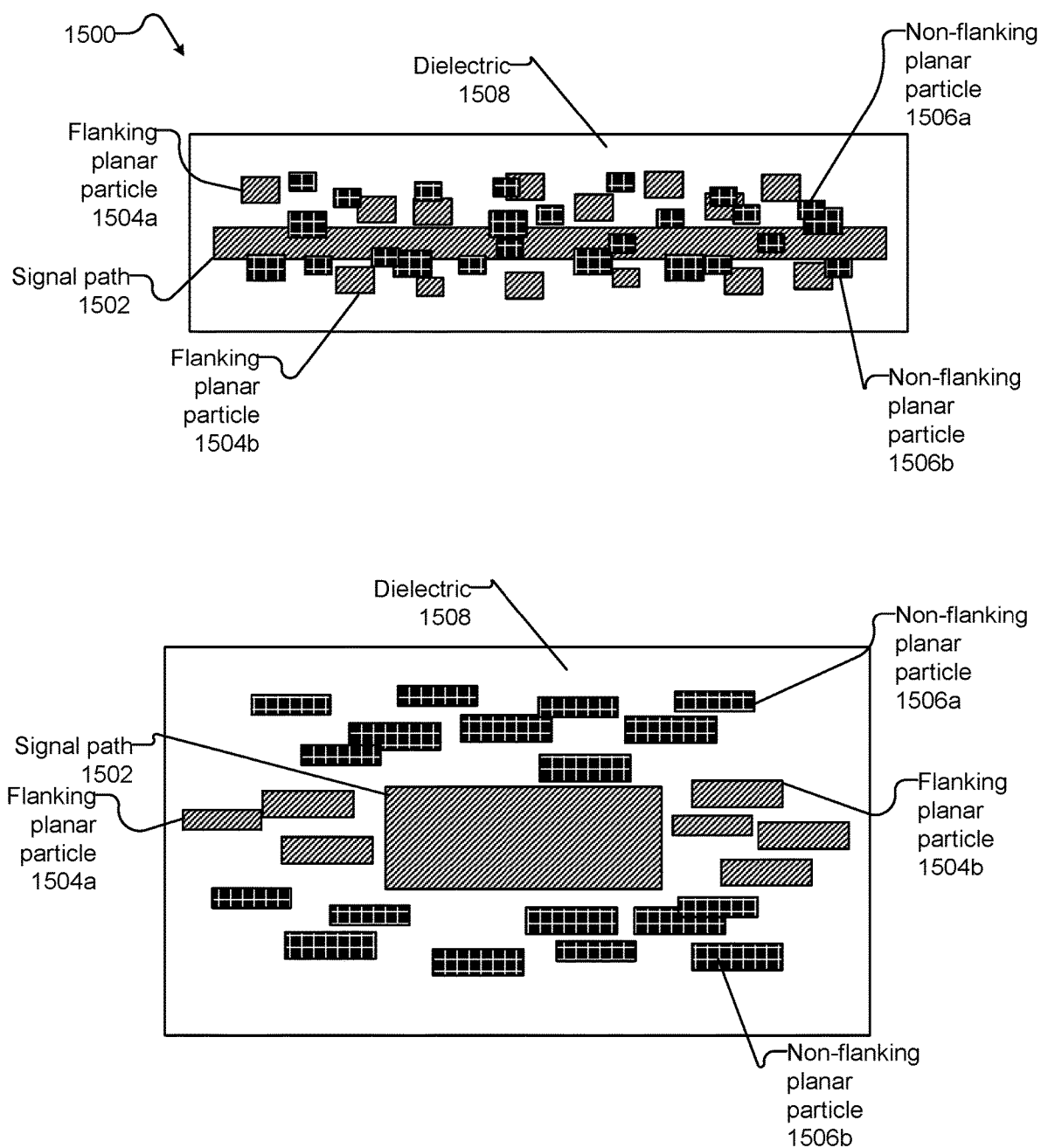
FIG. 15 is a set of two cross-sectional views of an example integrated circuit including planar particles.

FIG. 15 is set of two sectional views of an integrated circuit 1500 including planar particles in accordance with the present systems and methods. Planar particles surround a signal path 1502 to isolate signal path 1502 from electromagnetic radiation. In some implementations, signal path 1502 can be a broadband transmission line that operates at frequencies in the MHz range. Planar particles that surround transmission line 1502 can include flanking planar particles 1504a, 1504b (collectively 1504, only two called out to avoid clutter) and non-flanking planar particles 1506a, 1506b (collectively 1506, only two called out to avoid clutter). Each one of flanking planar particles 1504 can be positioned along a length of signal path 1502 between an upper plane that is level with an upper surface of signal path 1502 and a lower plane that is level with a lower surface of signal path 1502. Signal path 1502 can comprise a set of wire portions that are electrically coupled to form at least a portion of signal path 1502. At least one of flanking planar particles 1504 and at least one wire portion of signal path 1502 can be fabricated in the same act of a fabrication method, such as method 1600 of FIG. 16. Flanking planar particles 1504 and signal path 1502 can comprise a material that is superconductive in a range of temperatures (e.g., niobium, aluminum, zinc, etc.).

A first set of non-flanking planar particles 1506 can be positioned above the upper plane that is level with the upper surface of signal path 1502. A second set of non-flanking planar particles 1506 can be positioned below the lower plane that is level with the lower surface of signal path 1502. In one implementation, at least one of non-flanking planar particles 1506 and the set of wire portions of signal path 1502 can be fabricated at different acts of a fabrication method, such as method 1600 of FIG. 16. Non-flanking planar particles 1506 can comprise a semiconductor material (e.g., silicon, germanium, gallium arsenide, etc.). In some implementations, non-flanking planar particles 1506 can comprise a normal conductor material (e.g., gold, copper, silver, etc.).

Each one of flanking planar particles 1504 and each one of non-flanking planar particles 1506 can be surrounded by dielectric 1508. Dielectric 1508 can be interposed between each of: flanking planar particles 1504, non-flanking planar particles 1506, and signal path 1502. Flanking planar particles 1504 and non-flanking planar particles 1506 can be randomly distributed to surround signal path 1502. In some implementation, flanking planar particles 1504 and non-flanking planar particles 1506 can be distributed to form an ordered array that surrounds signal path 1502.

Figure 16:
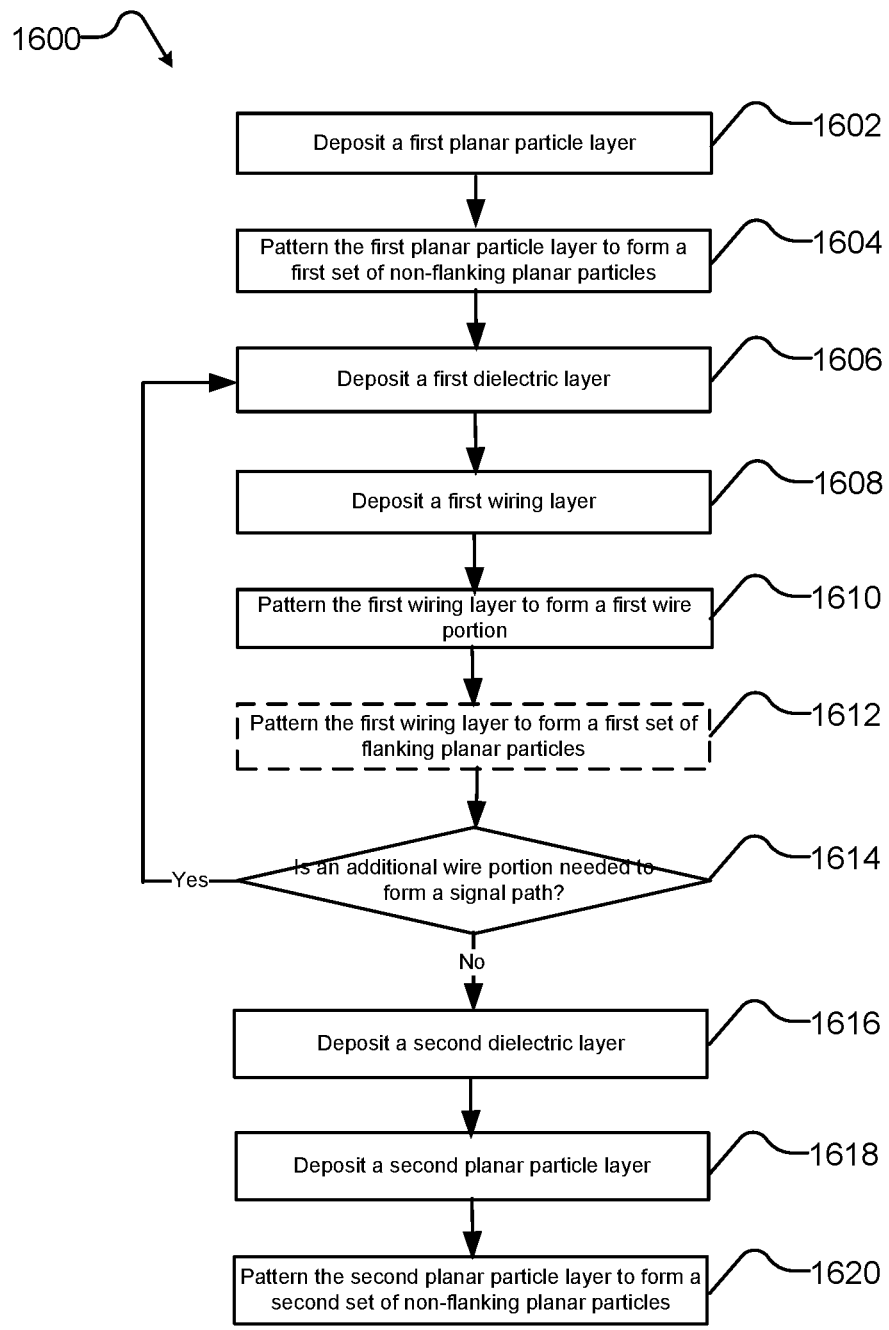
FIG. 16 is a flowchart illustrating a method for fabricating an integrated circuit including planar particles, such as the integrated circuit illustrated in FIG. 15.

FIG. 16 shows a method 1600 for fabricating an integrated circuit including planar particles in accordance with the present systems and methods. Method 1600 includes acts 1602-1620, though in other implementations, certain acts can be omitted and/or additional acts can be added. Method 1600 starts at 1602.

At 1602, a first planar particle layer is deposited to overlie a substrate. The first planar particle layer can comprise a semiconductor material (e.g., silicon, germanium, gallium arsenide, etc.). The substrate can comprise silicon. In other implementations, the first planar particle layer can comprise a material that is superconductive in a range of temperatures (e.g., aluminum, niobium, zinc, etc.). In some implementations, the first planar particle layer can comprise a normal conductor material (e.g., gold, copper, silver, etc.).

At 1604, the first planar particle layer is patterned to form a first set of non-flanking planar particles. Patterning the first planar particle layer can include masking and etching the first planar particle layer. Masking the first planar particle layer can include depositing a soft mask comprising photoresist on the first planar particle layer. An exposed portion of the first planar particle layer can then be removed via etching.

In some implementations, acts 1602-1604 can be repeated to form an additional set of non-flanking planar particles. Each additional planar particle layer can be etched to form a random distribution, an ordered array, or a combination of randomly distributed and ordered array of non-flanking planar particles.

At 1606, a first dielectric layer is deposited to overlie the first set of non-flanking planar particles. The first dielectric layer is then polished back to a degree that the first dielectric layer overlies the first set of non-flanking planar particles (i.e., the upper surface of the first set of non-flanking planar particles is not exposed). Each planar particle of the first set of non-flanking planar particles can be surrounded by the first dielectric layer. In some implementations, polishing can be performed via chemical mechanical planarization.

At 1608, a first wiring layer is deposited to overlie the first dielectric layer. The first wiring layer can comprise a material that is superconductive in a range of temperatures (e.g., niobium, aluminum, zinc, etc.).

At 1610, the first wiring layer is patterned to form a first wire portion. Patterning the first wiring layer can include masking and etching the first wiring layer. The first wire portion can be one of a plurality of wire portions that can electrically couple to one another to form a signal path. Masking the first wiring layer can include depositing a soft mask comprising photoresist, and then stripping and rinsing the soft mask.

At 1612, in an optional act, the first wiring layer is patterned to form an first set of flanking planar particles. Patterning the first wiring layer to form the first set of flanking planar particles can include forming an additional set of particles that are offset from the first planar particles. In one implementation, the first set of flanking planar particles can comprise a superconductive material and the first set of non-flanking planar particles can comprise at least one of: a semiconductor material, a normal conductor material, or a combination thereof.

At 1614, if an additional wire portion is not needed to form a signal path, act 1616 is performed. If an additional wire portion is needed to form a signal path, act 1606 is continued. Continuing act 1606 can include depositing an additional dielectric layer to overlie the first wire portion and polishing back the additional dielectric layer to the upper surface of the first wire portion so that the upper surface of the first wire portion is exposed. Exposing the upper surface of the first wire portion allows the first wire portion to electrically couple to an additional wire portion to be fabricated in subsequent acts.

At 1616, if an additional wire portion is not needed, a second dielectric layer is deposited to overlie the first wire portion. The second dielectric layer is then polished back to a degree that the second dielectric layer overlies the first wire portion (i.e., the upper surface of the first wire portion is not exposed). If an additional wire portion are needed at 1614, then the second dielectric layer is deposited to overlie the additional wire portion. The second dielectric layer is then polished back to a degree that the second dielectric layer overlies the additional wire portion (i.e., the upper surface of the additional wire portion is not exposed).

At 1618, a second planar particle layer is deposited to overlie a wire portion fabricated in preceding acts of method 1600. The second planar particle layer can comprise a semiconductor material (e.g., silicon, germanium, gallium arsenide, etc.). In other implementations, the second planar particle layer can comprise a superconductive material. In some implementations, the second planar particle layer can comprise a normal conductor material.

At 1620, the second planar particle layer is patterned to form a second set of non-flanking planar particles. Patterning the second planar particle layer can include masking and etching the second planar particle layer. Masking the second planar particle layer can include depositing a soft mask comprising photoresist on the second planar particle layer. An exposed portion of the second planar particle layer can then be removed via etching. Optionally, an overlying dielectric layer can then be deposited on top of the second set of planar particles.

In some implementations, acts 1616-1620 can be repeated to form an additional set of non-flanking planar particles. Each additional planar particle layer can be etched to form a random distribution, an ordered array, or a combination of randomly distributed and ordered array of non-flanking planar particles.

FIGS. 17A to 17H show a sectional view of a portion of an integrated circuit including planar particles, such as integrated circuit 1500 in FIG. 15, fabricated at successive stages of fabrication, according to method 1600 of FIG. 16.

Figure 17A:
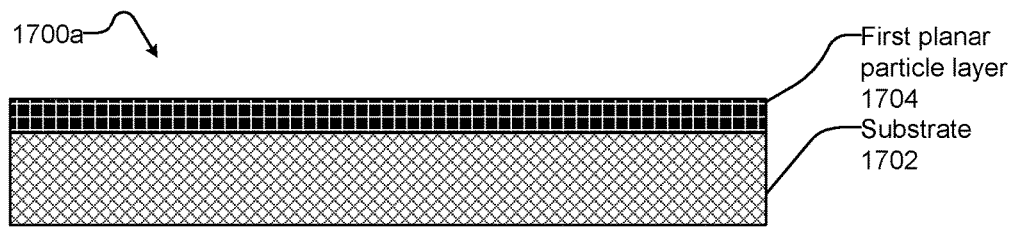
FIGS. 17A to 17H show a cross-sectional view of an example integrated circuit including planar particles fabricated at successive stages of fabrication.

FIG. 17A is a sectional view of a portion of an integrated circuit 1700a including planar particles at a first stage of a fabrication process described by method 1600 of FIG. 16. Circuit 1700a comprises a substrate 1702 and a first planar particle layer 1704. In some implementations, substrate 1702 is a silicon substrate. In some implementations, first planar particle layer 1704 comprises a material that is superconductive within a range of temperatures. For example, first planar particle layer 1704 may comprise a material selected from: zinc, niobium, and aluminum. In some implementations, first planar particle layer 1704 comprises a semiconductor material. Examples of a semiconductor material that can be used include at least one of silicon, germanium, gallium arsenide, and a combination thereof. In other implementations, first planar particle layer 1704 comprises a normal conductive material. Examples of a normal conductive material that can be used include at least one of: copper, gold, silver, and a combination thereof.

Figure 17B:
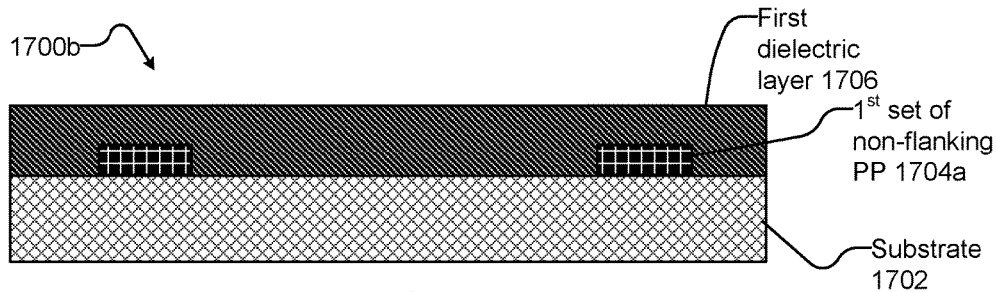

FIG. 17B is a sectional view of a portion of an integrated circuit 1700b at a subsequent stage of the fabrication process. Circuit 1700b can be formed from circuit 1700a of FIG. 17A by patterning first planar particle form a first set of non-flanking planar particles 1704a, and by depositing a first dielectric layer 1706 and polishing first dielectric layer 1706. Patterning first planar particle layer 1704 can include masking and etching a portion of first planar particle layer 1704. Polishing first dielectric layer 1706 can include planarizing planar particle layer 1704 by using chemical mechanical planarization. In one implementation, each planar particle of the first set of non-flanking planar particles 1704a can each have a size on the order of hundreds of nanometers. For example, each planar particle can have a width of 250 nanometers and a length of less than 250 nanometers.

Figure 17C:
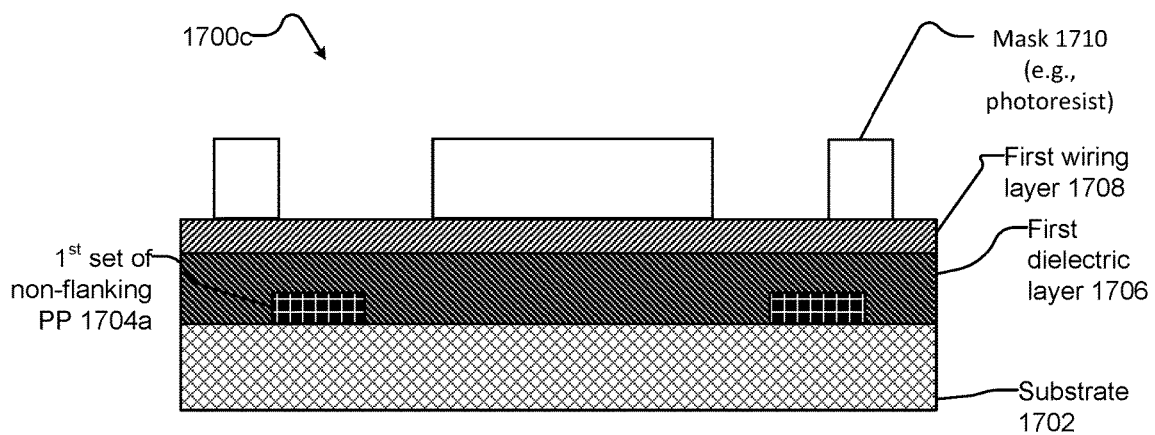

FIG. 17C is a sectional view of a portion of an integrated circuit 1700c at a subsequent stage of the fabrication process. Circuit 1700c can be formed from circuit 1700b of FIG. 17B by depositing a first wiring layer 1708. A mask 1710 can be deposited on top of first wiring layer 1708. A portion of first wiring layer 1708 can be exposed and etched. For example, a portion of first wiring layer can be etched using wet etching or dry etching. In one implementation, mask 1710 can be a soft mask comprising photoresist that includes organic material. In another implementation mark 1710 can be a hard mask comprising silicon dioxide.

Figure 17D:
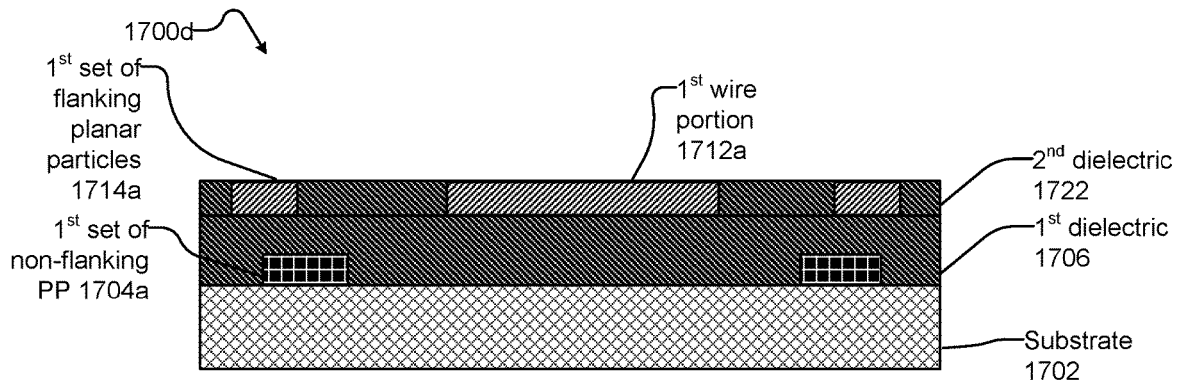

FIG. 17D is a sectional view of a portion of an integrated circuit 1700d at a subsequent stage of the fabrication process. Circuit 1700d can be formed from circuit 1700c of FIG. 17C by etching a portion of first wiring layer 1708. Etching a portion of first wiring layer can form a first wire portion 1712a and a first set of flanking planar particles 1714a. A second dielectric layer 1722 is deposited and polished back to the upper surface of first wire portion 1712a and first set of flanking planar particles 1714a. In one implementation, first set of flanking planar particles 1714a comprises the same material as first set of non-flanking planar particles 1704a. For example, first set of flanking planar particles 1714a and first set of non-flanking planar particles 1704a can comprise a material that is superconductive in a range of temperatures (e.g., zinc, niobium, aluminum, etc.). In some implementations, first set of non-flanking planar particles 1704a comprises a first material and first set of flanking planar particles 1714a comprises a second material that is different from the first material. For example, first set of non-flanking planar particles 1704a can comprise a semiconductor material (e.g., silicon, silicon carbide, etc.) and first set of flanking planar particles 1714a can comprise a material that is superconductive in a range of temperatures (e.g., zinc, niobium, aluminum, etc.). In some implementations, at least one of first set of non-flanking planar particles 1704a and first set of flanking planar particles comprises a normal conductor material.

Figure 17E:
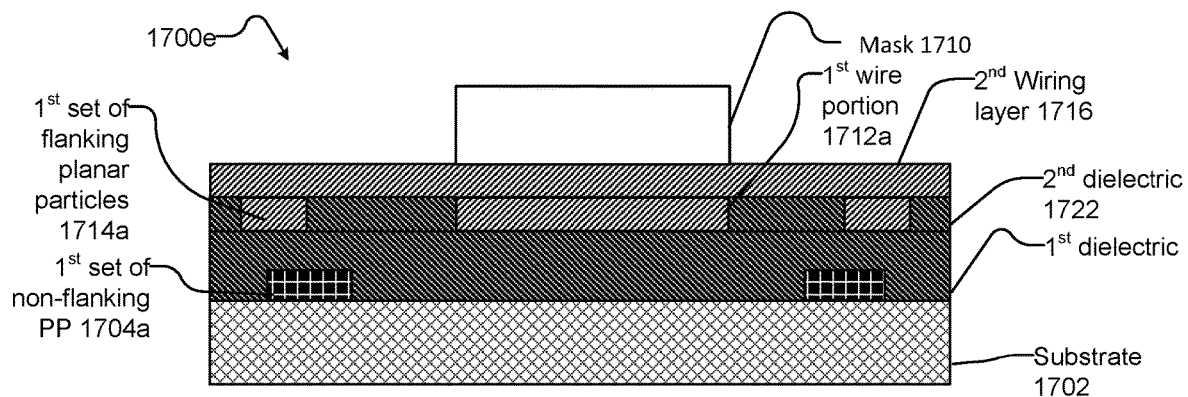

FIG. 17E is a sectional view of a portion of an integrated circuit 1700e at a subsequent stage of the fabrication process. Circuit 1700e can be formed from circuit 1700d of FIG. 17D by depositing a second wiring layer 1716 to overlie first wire portion 1712a. Second wiring layer 1716 can comprise the same material as first wire portion 1712a. For example, second wiring layer 1716 can comprise a material that is superconductive in a range of temperatures. Mask 1710 can be deposited on second wiring layer 1716 to cover a portion of second wiring layer 1716 that overlies first wire portion 1712a. Mask 1710 can be a soft mask comprising photoresist or a hard mask.

Figure 17F:
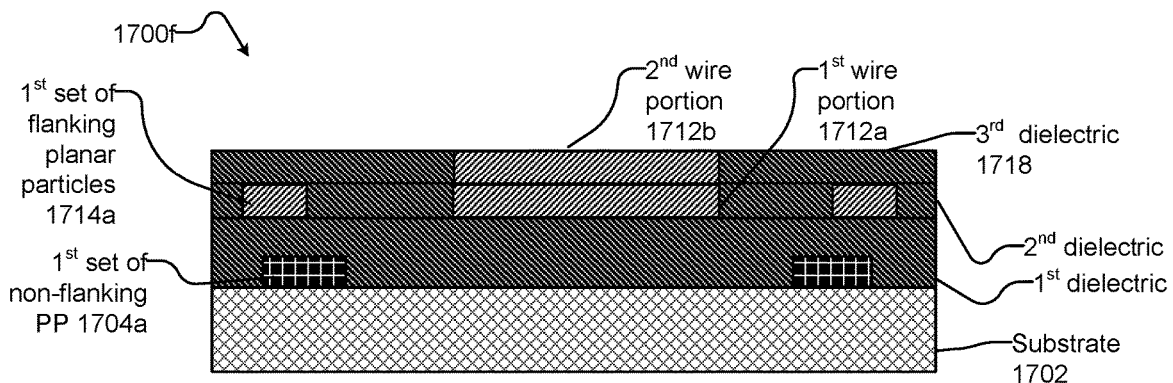

FIG. 17F is a sectional view of a portion of an integrated circuit 1700f at a subsequent stage of the fabrication process. Circuit 1700f can be formed from circuit 1700d of FIG. 17E by etching an exposed portion of second wiring layer 1716 to form a second wire portion 1712b. A third dielectric layer 1718 is deposited and polished back to an upper surface of second wire portion 1712b.

Figure 17G:
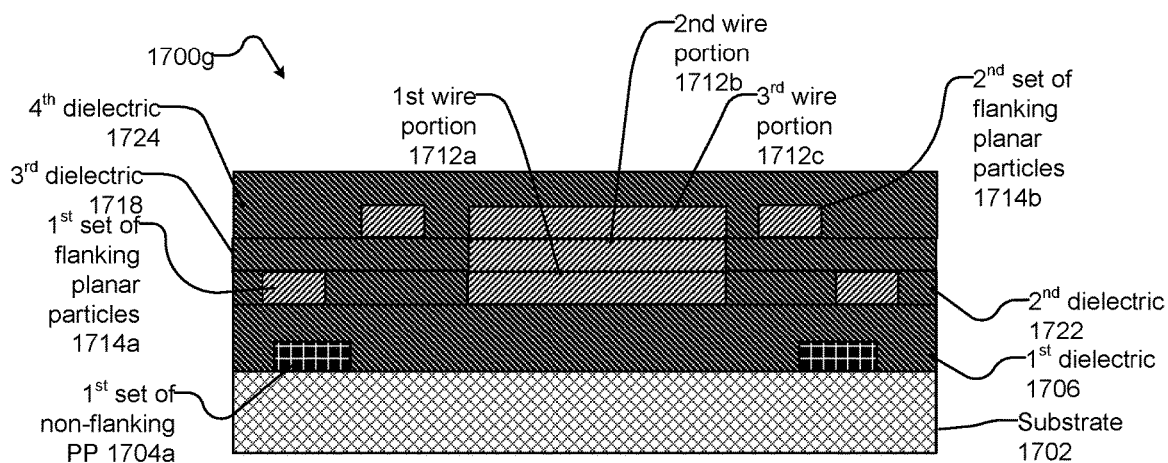

FIG. 17G is a sectional view of a portion of an integrated circuit 1700g at a subsequent stage of the fabrication process. Circuit 1700g can be formed from circuit 1700f of FIG. 17F by depositing a third wiring layer to overlie second wire portion 1712b, depositing mask 1710, and etching an exposed portion of the third wiring layer to form a third wire portion 1712c and a second set of flanking planar particles 1714b. Third wire portion 1712c, second wire portion 1712b, and first wire portion 1712a (collectively 1712) can comprise the same material. Wire portions 1712 can be electrically coupled to one another to form at least a portion of a signal path in integrated circuit 1700g. A fourth dielectric layer 1724 is deposited on top of wire portions 1712 and second set of flanking planar particles 1714b, and then polished back. Second set of flanking planar particles 1714b can comprise the same material as wire portions 1712 and first set of flanking planar particles 1714a. In one implementation, second set of flanking planar particles 1714b can comprise a first material and first set of non-flanking planar particles 1704 can comprise a second material that is different from the first material. For example, second set of flanking planar particles 1714b can comprise a material that is superconductive in a range of temperatures and first set of non-flanking planar particles can comprise at least one of a normal conductor material and a semiconductor material.

Figure 17H:
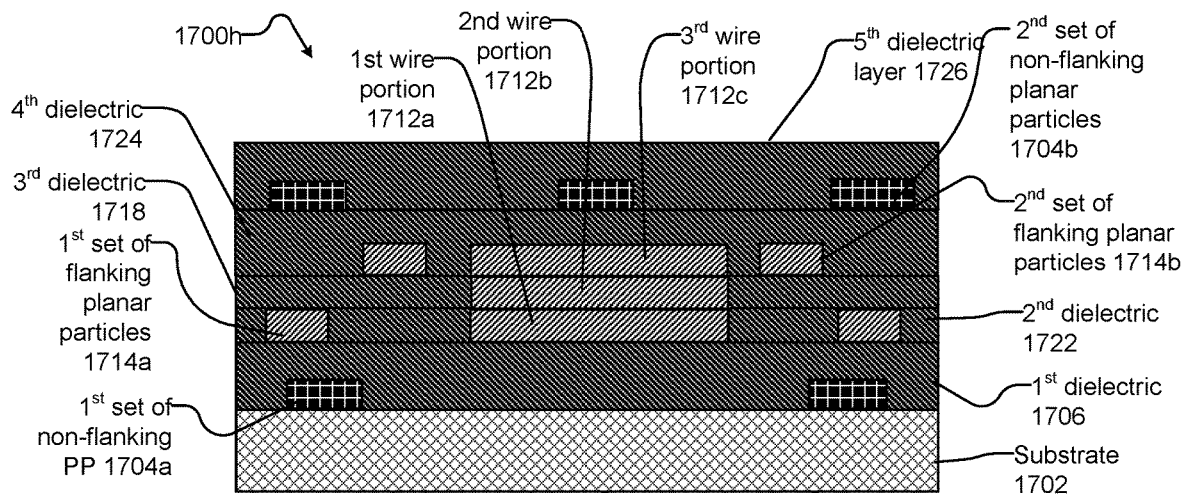

FIG. 17H is a sectional view of a portion of an integrated circuit 1700h at a subsequent stage of the fabrication process. Circuit 1700h can be formed from circuit 1700g of FIG. 17G by depositing and patterning a fourth planar particle layer to form a second set of non-flanking planar particles 1704b. Patterning a fourth planar particle layer can include masking and etching the fourth planar particle layer. A fifth dielectric layer 1726 is deposited on second set of non-flanking planar particles 1704b and polished back.

Second set of non-flanking planar particles 1704b can comprise a first material and second set of flanking planar particles 1714b can comprise a second material that is different from the first material. In one implementation, second set of non-flanking planar particles 1704b and first set of non-flanking planar particles 1704 can comprise a first material and first set of flanking planar particles 1714a and second set of flanking planar particles 1714b can comprise a second material that is different from the first material. For example, first set of non-flanking planar particles 1704 and second set of non-flanking planar particles can comprise a semiconductor material such as doped silicon and each of: first set of flanking planar particles 1714a, second set of flanking planar particles 1714b, and wire portions 1712 can comprise a superconductive material such as niobium. Each planar particle in a respective set of planar particles can be sized to reduce the effect of electromagnetic radiation on a signal path at least partially formed from wire portions 1712. Second set of non-flanking planar particles 1704b and first set of non-flanking planar particles 1704 can comprise a material that is selected to reduce the effect of a magnetic field resulting from current carried by a signal path at least partially formed from wire portions 1712.

In some implementations, circuit 1700h can include more or less than four planar particle layers. More than three wire portions can be electrically coupled to form at least a portion of a signal path. In some implementations, a via that electrically couples signal paths can be formed between wire portions. Each set of planar particles can include planar particles of different sizes. In one implementation, planar particles can each have a size on the order of hundreds of nanometers. Planar particles can be arranged in a random distribution, an ordered array, or a combination thereof.

The I/O systems and devices described herein may be used to provide superconducting electrical communication with at least one superconducting device. The I/O systems and devices described herein may also serve to provide thermalization and shielding of the at least one superconducting device for which superconducting electrical communication is desired.

The various embodiments described herein may be employed in both superconducting and non-superconducting applications. In superconducting applications, the inner conductor(s) (e.g., conductive wire 104, 1002, or 1106) may be formed of a material that is superconducting below a critical temperature. Example materials include zinc, niobium, aluminum, tin, and lead, though those of skill in the art will appreciate that other superconducting materials may be used. It is generally preferable that the outer conductive housing of a metal powder filter be formed of a material that is not superconducting. Example materials include copper and brass, though those of skill in the art will appreciate that other non-superconducting materials may be used.

Throughout this specification and the appended claims, reference is often made to "metal powder," "a mixture of metal powder and epoxy," and "a metal powder epoxy mixture." In general, it is preferable that the metal implemented in such powders/mixtures be non-superconducting. Example materials include copper powder and brass powder, though those of skill in the art will appreciate that other materials may be used. In some embodiments, the "metal powder" may comprise fine metal grains. In alternative embodiments, the "metal powder" may comprise large metal pieces such as metal filings and/or wire clippings or microscopic metal particles such as nanocrystals. The term "epoxy" is used herein to refer to a substance that provides the chemical functionality associated with an epoxide (i.e., a cyclic ether having three ring atoms; namely, two carbon atoms and one oxygen atom), and more generally to the reaction product of molecules containing multiple epoxide groups (an epoxy resin) with various chemical hardeners to form a solid material, as will be appreciated by those of skill in the chemical arts.

Certain aspects of the present systems and devices may be realized at room temperature, and certain aspects may be realized at a superconducting temperature. Thus, throughout this specification and the appended claims, the term "superconducting" or "superconductive" when used to describe a physical structure such as a "superconducting wire" or "superconductive material" is used to indicate a material that is capable of behaving as a superconductor at an appropriate temperature. A superconducting material may not necessarily be acting as a superconductor at all times in all embodiments of the present systems and devices. It is also noted that the teachings provided herein may be applied in non-superconducting applications, such as in radio frequency transformers formed out of gold.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus, not necessarily the example systems, methods and apparatus generally described above.

The various embodiments described above can be combined to provide further embodiments. All of the U.S. patents, U.S. patent application publications, U.S. patent applications, including but not limited to U.S. Provisional Patent Application No. 62/560,491, U.S. Pat. Nos. 8,346, 325, 8,670,809, 8,441,329, 8,008,991, 8,279,022, 9,231,181, 8,159,313, 8,405,468 and US Patent Publication No. 2017/0178018 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system comprising an electrical signal filtering device, the electrical signal filtering device comprising:
    a tubular outer conductor having an outer surface and an inner surface, and a longitudinal passage bounded by the inner surface of the tubular outer conductor, the longitudinal passage having a longitudinal center axis;
    an inner conductor having an outer surface, the inner conductor extending through the longitudinal passage in a direction parallel to the longitudinal center axis; and
    a dissipative matrix distributed in the longitudinal passage to occupy at least a portion of a volume defined by the inner surface of the tubular outer conductor and the outer surface of the inner conductor, wherein the dissipative matrix comprises a first material that is superconductive in a respective range of temperatures, and wherein the first material is selected to tune a characteristic of a frequency response of the electrical signal filtering device.

2. The system of claim 1 wherein the dissipative matrix further comprises at least one of a non-conductive ferromagnetic and non-conductive paramagnetic material.

3. The system of claim 1 wherein the characteristic of the frequency response of the electrical signal filtering device is a cut-off frequency of the electrical signal filtering device.

4. The system of claim 1 wherein the dissipative matrix comprises at least one superconducting powder selected from the group consisting of a superconducting metal, a superconducting oxide, and a superconducting ceramic, the at least one superconducting powder comprising the first material.

5. The system of claim 4 wherein the at least one superconducting powder has a particle size of the same order of magnitude as the London penetration depth of the first material.

6. The system of claim 1 wherein the dissipative matrix comprises a normal metal powder, the normal metal powder including a coating, the coating comprising the first material.

7. The system of claim 6 wherein the normal metal powder comprises at least one of a ferromagnetic and a paramagnetic material.

8. The system of claim 6 wherein the coating has a thickness of the same order of magnitude as the London penetration depth of the first material.

9. The system of claim 1 wherein at least one of a) the inner surface of the tubular outer conductor, b) the outer surface of the tubular outer conductor, and c) the outer surface of the inner conductor has a coating, the coating comprising the first material.

10. The system of claim 9 wherein the coating has a thickness of the same order of magnitude as the London penetration depth of the first material.

11. The system of claim 1 wherein the tubular outer conductor has a cross-sectional geometry that is non-circular.

12. The system of claim 1 wherein the inner conductor comprises the first material.

13. The system of claim 1 wherein the inner conductor extending through the longitudinal passage is collinear with the longitudinal center axis.

14. The system of claim 1, further comprising a magnetic field generator which in operation applies a magnetic field to the dissipative matrix, the magnetic field selected to tune the characteristic of the frequency response of the electrical signal filtering device.

15. The system of claim 14 wherein the magnetic field generator is an electromagnetic coil which in operation passes a current, the current selected to tune the characteristic of the frequency response of the electrical signal filtering device.

16. The system of claim 14 wherein the characteristic of the frequency response of the electrical signal filtering device is a cut-off frequency of the electrical signal filtering device.

17. A method of fabricating an electrical signal filtering device comprising:
   providing a tubular outer conductor comprising a longitudinal passage bounded by an inner surface of the tubular outer conductor;
   positioning an inner conductor to extend through the longitudinal passage in a direction parallel to a longitudinal center axis of the longitudinal passage; and
   distributing a dissipative matrix in the longitudinal passage to occupy at least a portion of a volume defined by the inner surface of the tubular outer conductor and an outer surface of the inner conductor, wherein the dissipative matrix comprises a first material which is superconductive in a respective range of temperatures, and wherein the first material is selected to tune a characteristic of a frequency response of the electrical signal filtering device.

18. The method of claim 17 wherein positioning an inner conductor to extend through the longitudinal passage in a direction parallel to a longitudinal center axis of the longitudinal passage includes:
   forming an assembly by:
      inserting a first end of an inner conductor into a first receptacle that is fixed in a first coaxial connector;
      soldering the first end of the inner conductor to the first receptacle that is fixed in the first coaxial connector;
      inserting a second end of the inner conductor into a second receptacle;
      soldering the second end of the inner conductor to the second receptacle;
   inserting the assembly into the volume defined by the inner surface of the tubular outer conductor and the outer surface of the inner conductor;
   fastening the first coaxial connector to a first end of the tubular outer conductor; and then
   fastening a second coaxial connector to a second end of the tubular outer conductor such that the second receptacle is concurrently inserted into the second coaxial connector.

19. The method of claim 18 wherein distributing the dissipative matrix in the longitudinal passage comprises injecting the dissipative matrix into the longitudinal passage and rotating the electrical signal filtering device while the dissipative matrix is curing.

* * * * *